(12) United States Patent
Tsai et al.

(10) Patent No.: US 10,546,917 B1
(45) Date of Patent: Jan. 28, 2020

(54) TRENCH CAPACITOR LAYOUT STRUCTURE AND METHOD OF FORMING SAME BACKGROUND

(71) Applicant: TAIWAN SEMICONDUCTOR MANUFACTURING COMPANY, LTD., Hsinchu (TW)

(72) Inventors: Yu-Hsiang Tsai, Hsinchu (TW); Chung-Chuan Tseng, Hsinchu (TW); Chia-Ping Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/117,479

(22) Filed: Aug. 30, 2018

(51) Int. Cl.
*H01L 49/02* (2006.01)
*H01L 21/308* (2006.01)

(52) U.S. Cl.
CPC ............ *H01L 28/91* (2013.01); *H01L 21/308* (2013.01)

(58) Field of Classification Search
CPC ................................ H01L 28/91; H01L 21/308
See application file for complete search history.

(56) References Cited

U.S. PATENT DOCUMENTS

2016/0163729 A1* 6/2016 Zhang ............... H01L 27/11582
257/321

* cited by examiner

*Primary Examiner* — Anthony Ho
(74) *Attorney, Agent, or Firm* — Hauptman Ham, LLP

(57) ABSTRACT

A semiconductor structure includes a substrate having a trench array therein. The trench array includes a plurality of outer trenches adjacent to and extending along a periphery of the trench array and a plurality of inner trenches. Each of the plurality of outer trenches has a width greater than a width of each of the plurality of inner trenches. A capacitor material stack over the trench array.

20 Claims, 20 Drawing Sheets

TRENCH CAPACITOR LAYOUT STRUCTURE AND METHOD OF FORMING SAME BACKGROUND

BACKGROUND

Deep trench capacitors provide high capacitance density without increasing a surface area of a semiconductor substrate dedicated to the capacitor structure, and are used in a variety of integrated circuits as a charge storage device of a memory cell, a passive component of a radio frequency circuit, or a decoupling device that promotes a stable voltage supply in an integrated circuit.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

Figure 1A:
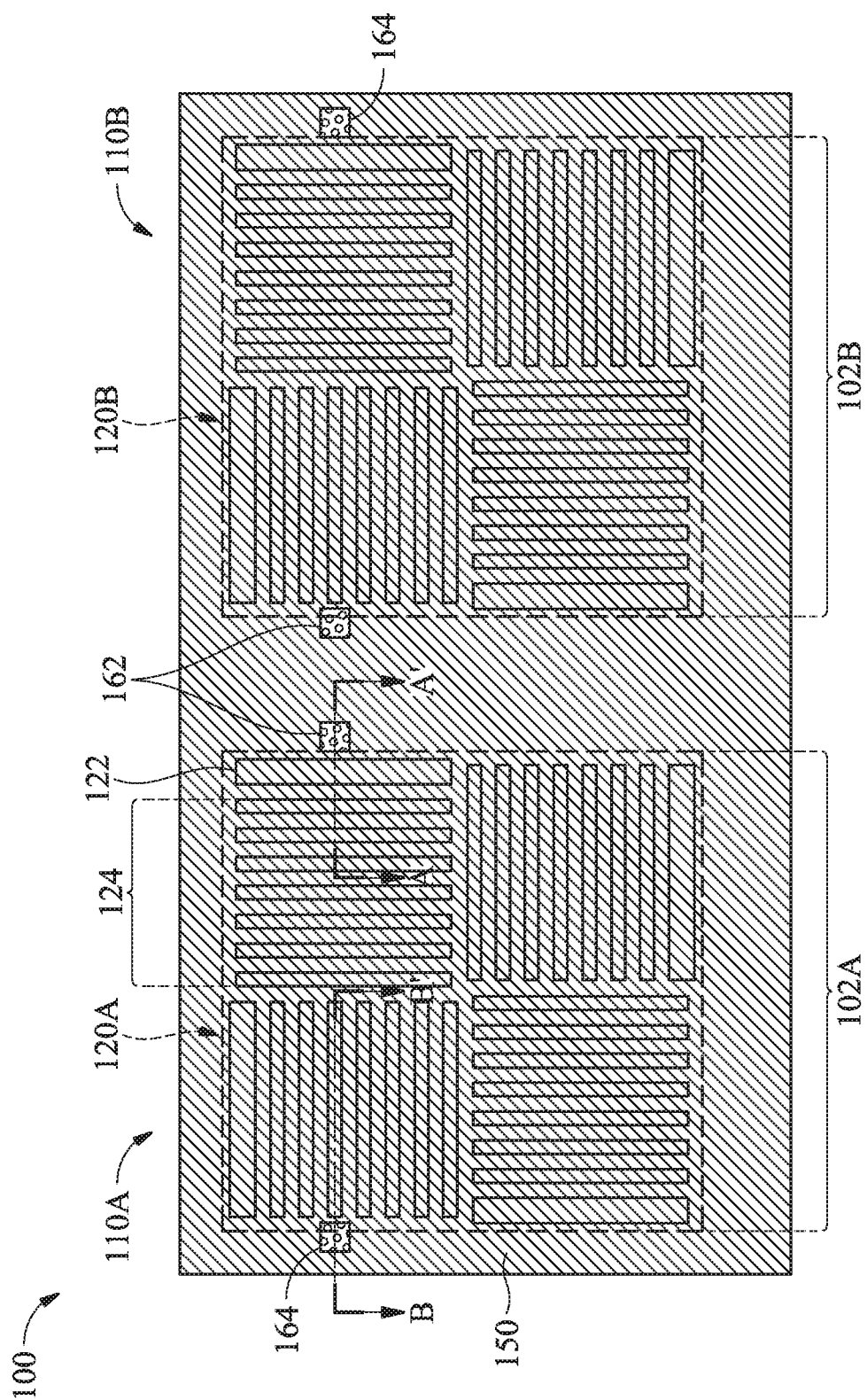
FIG. 1A is a top view of a semiconductor structure including a plurality of trench capacitors, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

As design rules utilized in the layout and manufacture of semiconductor devices such as DRAMs continue to reduce device dimensions in order to meet advanced device density and performance targets, semiconductor devices having closely-packed deep trench capacitors are more common. Methods of forming deep trench capacitors include etching trench arrays and multiple steps of depositing alternating conductive and dielectric layers in trench arrays followed by repeated cycles of patterning, etching, or pattern removal to produce the designed capacitors.

The process of etching trenches results in variations of trench width between the center and edge of a trench array. Edge loading, which causes the difference in trench width, is driven by the interaction between film removal chemistry and the amount of exposed substrate in a local region of the array of trenches. Because of edge loading, trenches that are located at the edge of a trench array are often narrower and shallower than those located in the middle of the trench array. These edge trenches induce defects in a photoresist, which cause incomplete etching of capacitor metals in the subsequent patterning. The metal residue bridges (i.e., shorts) neighboring deep trench capacitors, thus adversely affecting reliability of deep trench capacitors.

In the present disclosure, deep trench capacitors are disposed in trenches of trench arrays having wider trenches at edges. The wider trenches at the edge of trench array help to compensate for adverse edge loading effects on the photoresist pattern profile. The enlarged trench width at the edge of trench array helps to prevent formation of metal residue defects during the photolithography patterning process, thereby improving reliability of deep trench capacitors.

Figure 1B:
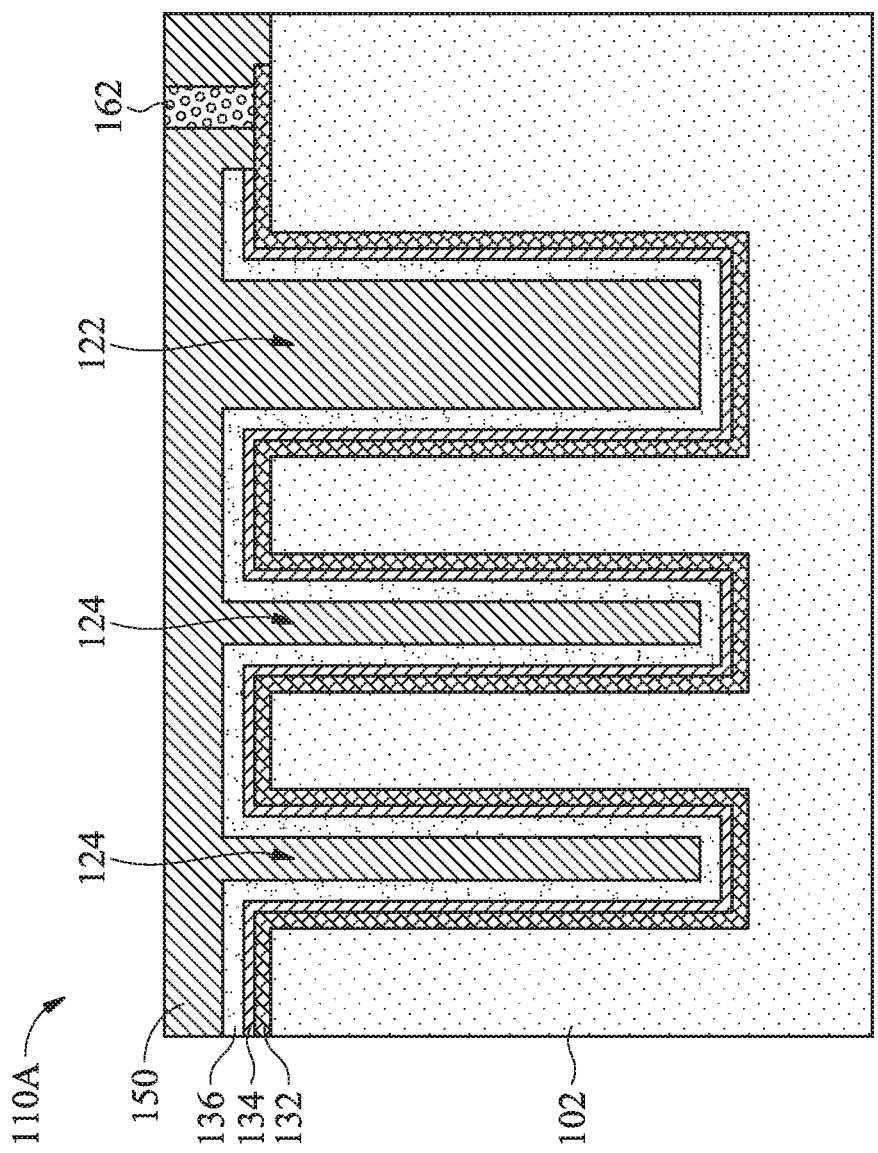
FIG. 1B is a cross-sectional view of a portion of the semiconductor structure of FIG. 1A along line A-A'.
Figure 1C:
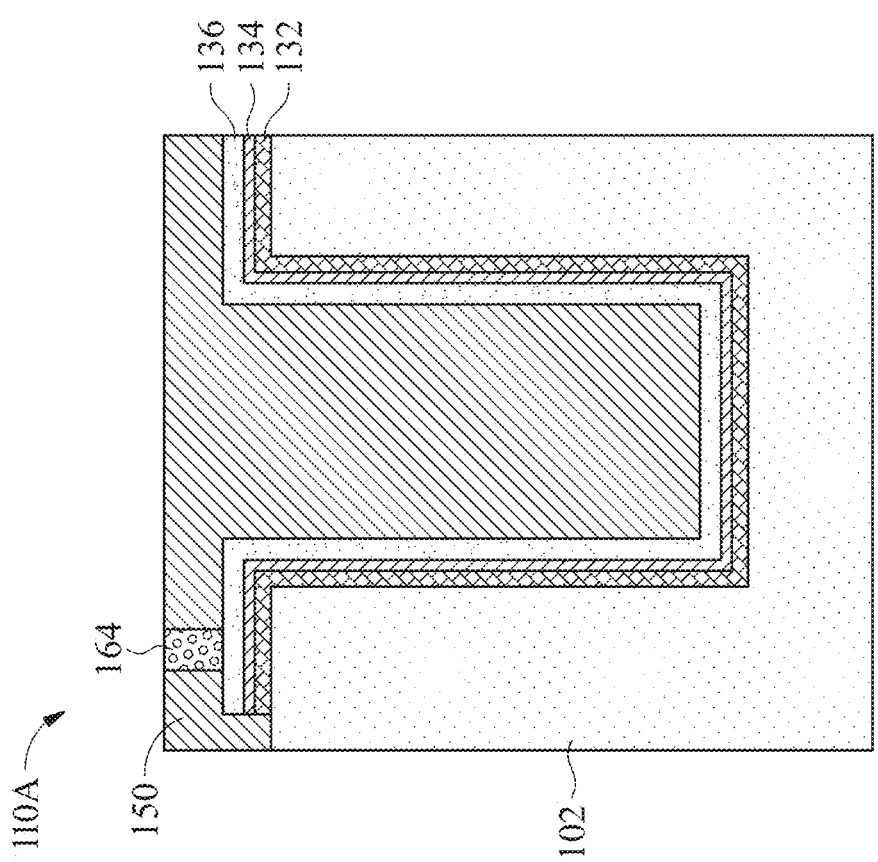
FIG. 1C is a cross-sectional view of another portion of the semiconductor structure of FIG. 1A along line B-B'.

FIGS. 1A-1C are views of a semiconductor structure 100 including a plurality of trench capacitors 110A, 110B, in accordance with some embodiments. FIG. 1A is a top view of semiconductor structure 100, FIG. 1B is a cross-sectional view of a portion of semiconductor structure 100 of FIG. 1A taken along line A-A', and FIG. 1C is a cross-sectional view of another portion of semiconductor structure 100 of FIG. 1A taken along line B-B'.

Referring to FIGS. 1A-1C, semiconductor structure 100 includes a substrate 102 and a plurality of trench capacitors formed therein. In some embodiments, a first trench capacitor 110A is formed in a first region 102A of substrate 102, and a second trench capacitor 110B is formed in a second region 102B of substrate 102 adjacent to the first region 102A. While two trench capacitors 110A, 110B are illustrated, any number of trench capacitors are contemplated. The first trench capacitor 110A is within a first trench array 120A, and the second trench capacitor 110B is within a second trench array 120B. To help reduce an abnormal photoresist pattern profile at the edge of trench array 120A, 120B in a photolithography process, outer trenches 122 at the edges of each trench array 120A, 120B and extending along directions parallel to corresponding edges of each trench array 120A, 120B are formed to have a width greater than a width of at least adjacent inner trenches 124. As used herein, inner trenches refer to trenches other than trenches adjacent the array edge.

In some embodiments, trench capacitors 110A, 110B are single metal-insulator-metal (MIM) capacitors and each include a lower capacitor electrode 132 over a top surface of a corresponding region of substrate 102A, 102B and along sidewall and bottom surfaces of trenches in a corresponding trench array 120A, 120B, an upper capacitor electrode 136, and a capacitor dielectric 134 between capacitor electrodes 132, 136 (e.g. trench capacitor 110A shown in FIGS. 1B and 1C). In some embodiments, trench capacitors 110A, 110B are stacked MIM capacitors and each includes multiple layers of capacitor electrodes with a capacitor dielectric between adjacent capacitor electrodes (not shown). An interlayer dielectric layer 150 is over substrate 102 and trench capacitors 110A, 110B. Contact plugs 162, 164 extend through ILD layer 150 and are electrically connected to lower capacitor electrode 132 and upper capacitor electrode 136, respectively. In drawings, two contact plugs are included for single MIM capacitors (e.g., trench capacitors 110A. 110B shown in FIGS. 1A-1C). In instances where trench capacitors 110A, 110B are stacked MIM capacitors, for each trench capacitor 110A or 110B, more than two contact plugs are formed to provide electrical connection to respective capacitor electrodes (not shown). In some embodiments, these contact plugs are electrically connected in different manners to adjust capacitance of each trench capacitor (e.g., trench capacitor 110A or 110B). For example, when all contact plugs for a stacked trench capacitor are interconnected together, a maximum capacitance is achieved.

FIGS. 2A-8B are views of a semiconductor structure at various stages of fabrication. Like items are indicated by like reference numerals, and for brevity, descriptions of the structure, provided with reference to previous figures will generally not be repeated in connection with subsequent figures.

Figure 2A:
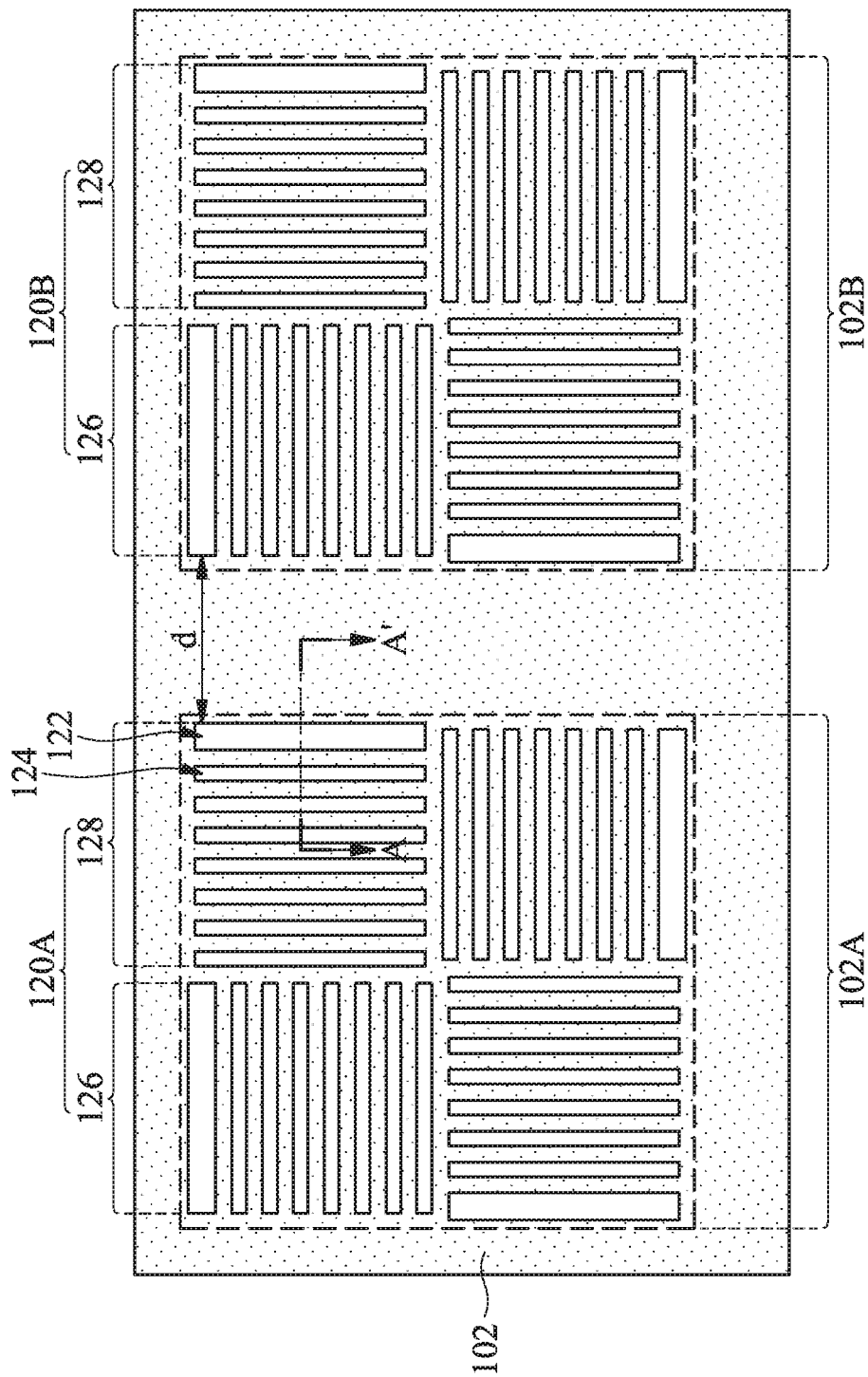
FIG. 2A is a top view of a semiconductor structure after etching a plurality of trench arrays in a substrate, in accordance with some embodiments.
Figure 2B:
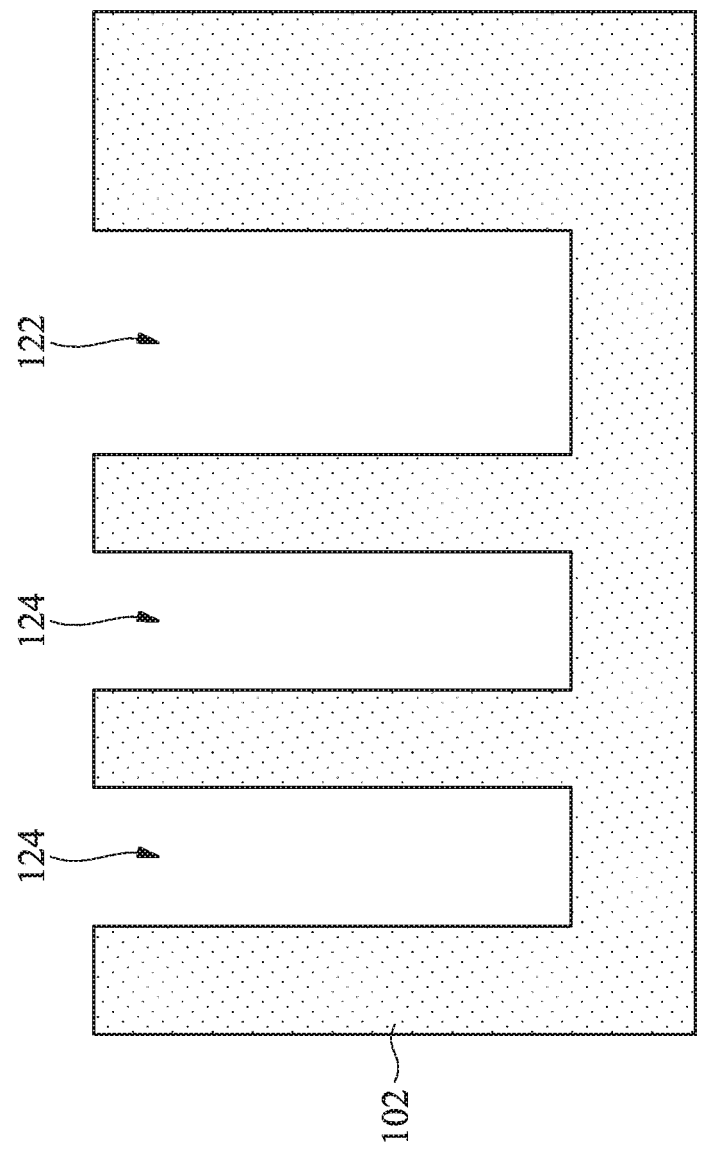
FIG. 2B is a cross-sectional view of a portion of the semiconductor structure of FIG. 2A along line A-A'.

FIG. 2A is a top view of a semiconductor structure following etching of trench arrays 120A, 120B in different regions (e.g., a first region 102A and a second region 102B) of substrate 102, in accordance with some embodiments. FIG. 2B is a cross-sectional view of a portion of the semiconductor structure of FIG. 2A taken along line A-A'.

Referring to FIGS. 2A and 2B, a substrate 102 is provided. In some embodiments, substrate 102 is a bulk semiconductor substrate including one or more semiconductor materials. Examples of suitable materials for substrate 102 include, but are not limited to, elementary semiconductor materials, compound semiconductor materials, and/or alloy semiconductor materials. Examples of elementary semiconductor materials include, but are not limited to, monocrystalline silicon (Si), polycrystalline silicon (poly-Si), amorphous silicon (a-Si), germanium (Ge), and/or diamond (C). Examples of binary compound semiconductor materials include, but are not limited to, IV-IV materials including silicon germanium (SiGe), germanium carbide (GeC), and silicon carbide (SiC), and III-V materials including gallium arsenide (GaAs), gallium phosphide (GaP), indium phosphide (InP), indium arsenide (InAs), and/or indium antimonide (InSb). Examples of tertiary and quaternary compound semiconductor materials include, but are not limited to, GaAsP, AlInAs, AlGaAs, GaInAs, GaInP, and/or GaInAsP.

In some embodiments, the semiconductor layer(s) incorporated in the substrate 102 are formed using a suitable technique or method including, but not limited to, metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), atomic layer deposition (ALD), and/or combinations thereof.

In some embodiments, the substrate 102 includes both a semiconductor material and an insulating material to form a semiconductor-on-insulator (SOI) substrate. In some embodiments, SOI substrates include one or more semiconductor layers formed on an insulating material such as silicon dioxide or sapphire (silicon-on-sapphire (SOS)). In some embodiments, the substrate 102 includes one or more epitaxial layer (epi-layer) and/or a strained layer resulting from an atomic and/or lattice mismatch.

In some embodiments, one or more dopant(s) are introduced into the substrate 102 during formation of the substrate 102, in the case of a single-layer substrate, or during formation of one or more layers comprising a multi-layer substrate. In some embodiments, one or more of the semiconductor materials included in a multi-layer substrate are undoped. In some embodiments, one or more of the semiconductor materials are doped with at least one p-type and/or n-type dopant depending on the functional and/or performance target parameters for the semiconductor devices being manufactured on the substrate. The term "p-type" refers to the addition of impurities to an intrinsic semiconductor that creates deficiencies of valence electrons.

Examples of p-type dopants, i.e., impurities, include, but are not limited to, boron, boron difluoride, gallium, and indium. "N-type" refers to the addition of impurities that contributes free electrons to an intrinsic semiconductor. Examples of n-type dopants, i.e., impurities, include, but are not limited to, antimony, arsenic, and phosphorous. In some embodiments, the semiconductor substrate 102 is doped with p-type dopants such as boron or boron difluoride.

Substrate 102 includes a plurality of trench arrays formed therein such as a first trench array 120A formed in a first region 102A of the substrate 102, and a second trench array 120B formed in a second region 102B of the substrate 102. While two trench arrays 120A, 120B are illustrated, any number of trench arrays are contemplated. In some embodiments, the spacing (d) between the first trench array 120A and the second trench array 120B is from about 2 micrometer (μm) to about 5 μm. If the spacing between trench arrays 120A, 120B is too small, the risk of bridging neighboring capacitors subsequently formed therein increases, in some instances. If the spacing between trench arrays 120A, 120B is too great, the substrate surface area is wasted, resulting in an undesirably low device packing density. In some embodiments and as shown in FIG. 2A, each of trench arrays 120A, 120B includes at least one first group of trenches 126 extending along a first direction, and at least one second group of trenches 128 extending along a second direction. In some embodiments, the second direction is different from the first direction. For example, in some embodiments, the second direction is substantially perpendicular to the first direction such that trenches in first groups of trenches 126 and trenches in second groups of trenches 128 are substantially perpendicular to one another. Additionally, in some embodiments, first groups of trenches 126 and second groups of trenches 128 are arranged adjacent to one another along the first direction and/or along the second direction. The perpendicular orientation of adjacent trench groups 126, 128 are employed to reduce wafer bow and wafer warpage. In some embodiments, the first direction is the same as the second direction. Thus, trenches in the first and second groups 126, 128 are aligned in the same direction (not shown). In some embodiments, numbers of first group and second group of trenches in each trench array, placement of first group and second group of trenches in each trench array, and numbers of trenches in each group of trenches are adjusted in order to meet a desired capacitance requirement while remaining within the scope of the present disclosure.

Within a respective group of trenches (e.g., first groups of trenches 126, second groups of trenches 128), in some embodiments and as shown, the trenches are arranged substantially parallel to one another, while in other embodiments, the trenches are configured to not intersect with one another, but are not parallel (not shown). While trenches are illustrated as rectangular structures, one of skill in the art would recognize that sizes and shapes of trenches is a matter of design choice. Other shapes of trenches such as annular, elliptical, oval, elongated, and complex shapes are within the scope of the present disclosure. The trenches within a respective group of trenches 126, 128 are typically deep trenches with an aspect ratio ranging from about 20:1 to about 100:1. The "aspect ratio" is the ratio of the depth of a trench to the width of the opening at the top of the trench. If the aspect ratio is too small, the surface area of trenches are too small, resulting in low capacitance, in some instances. If the aspect ratio is too great, the risk of trenches bending or collapsing increases, in some instances. In some embodiments, trenches within a respective group of trenches 126, 128 are uniformly spaced apart from one another. The spacing between adjacent trenches within each group of trenches 126, 128 ranges from about 0.1 μm to about 0.25 μm. If the spacing between adjacent trenches within a respective group of trenches 126, 128 is too small, the risk of trenches bending or collapsing, in some instances. If the spacing between adjacent trenches within a respective group of trenches 126, 128 is too great, the substrate surface area is wasted, resulting in an undesirably low device packing density.

Edge loading effect when etching a substrate using a pattern having a uniform trench width throughout the pattern results in differences, across a trench array, of trench sizes: edge trenches are narrower and shallower than center trenches of the trench array. The narrower edge trenches induce abnormal photoresist pattern profile, which causes incomplete etching of capacitor metals in the subsequent patterning processes. To help reduce abnormal photoresist pattern profile at edges of trench arrays 120A, 120B, outer trenches 122 at the periphery of each trench array 120A, 120B are formed to have a width greater than a width of at least adjacent inner trenches 124. In some embodiments, the width of outer trenches 122 ranges from about 10% to about 20% greater than the width of at least adjacent inner trenches 124. If the width difference between outer trenches 122 and adjacent inner trenches 124 is too small, the effect of eliminating abnormal photoresist pattern profile is not achieved, in some instances. If the width difference between outer trenches 122 and adjacent inner trenches 124 is too great, the effect of eliminating abnormal patterning does not change, but the substrate surface area is wasted, in some instances. In some embodiments, the inner trenches 124 in each trench array 120A, 120B have substantially the same width, while in some embodiments, the inner trenches 124 in each trench array 120A, 120B have different widths. In some embodiments, the width of inner trenches 124 ranges from about 0.1 μm to about 5 μm. In some embodiments, the width of inner trenches 122 ranges from about 0.12 μm to about 0.2 μm. If the width of inner trenches 124 is too small, difficulty in manufacturing trenches increases. If the width of inner trenches 124 is too great, the substrate surface area is wasted, resulting in an undesirably low device packing density.

In some embodiments, trench arrays 120A, 120B are formed using a mask and lithography etching processes. First, a mask layer (not shown) is deposited over a top surface of the substrate 102. In some embodiments, the mask layer is a soft mask, a hard mask or a hybrid soft/hard mask selected depending on parameters such as the etch conditions and chemistry or chemistries being utilized, the substrate material(s) being etched, and the depth of the trenches being formed. Examples of suitable materials for a mask layer include, but are not limited to, polyimide, silicon oxide, silicon nitride, silicon oxynitride, silicon oxycarbide, or combinations thereof. In some embodiments, the mask layer includes at least two materials, e.g., a layer of silicon oxide and a layer of silicon nitride, while in other embodiments, the mask layer includes one or more layers of a single material, e.g., silicon oxide. In some embodiments, the mask layer is deposited using chemical vapor deposition (CVD), physical vapor deposition (PVD), or plasma-enhanced chemical vapor deposition (PECVD). A photoresist layer is then formed on the mask layer, for example, by spin coating. The photoresist layer is subsequently patterned using a suitable lithography technique such as photolithography to provide a patterned photoresist layer (not shown) exposing portions of the mask layer. An example photolithography patterning process includes soft baking of the photoresist layer, mask aligning, exposure, post-exposure baking, developing the photoresist layer, rinsing, and drying (e.g., hard baking). Next, the exposed portions of the mask layer are removed to provide a patterned mask layer exposing portions of the substrate 102. Depending on the material(s) used, the mask layer is etched using a dry etching method with a plasma generated from a halogen-containing etchant selected, for example, from a group including $CF_4$, $SF_6$, $NF_3$, $Cl_2$, $CCl_2F_2$, $SiCl_4$, $BCl_2$, or a combination thereof. In some embodiments, a wet etching method using, for example, at least one aqueous etch solution including citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), tetramethylammonium hydroxide (TMAH), or a combination thereof, is utilized for removing the exposed portions of the mask layer. In some embodiments, the mask layer is etched using an etching sequence including both wet and dry etching techniques. In some embodiments, the patterned photoresist layer is removed before etching the substrate 102, for example, by ashing. In some embodiments, at least a portion of patterned photoresist layer remains as part of the mask. In some embodiments, after the patterned photoresist layer is removed, the surface of the patterned mask layer is subjected to additional cleaning to remove residual particles. Next, the portions of substrate 102 exposed by the patterned mask layer are etched to form trench arrays 120A, 120B. In some embodiments, the substrate 102 is etched using plasma etching or reactive ion etching (RIE). The patterned mask layer is removed during a subsequent chemical mechanical polishing (CMP) process. In some embodiments, one or more cleaning steps follow the formation of trench arrays 120A, 120B in substrate 102.

Figure 3A:
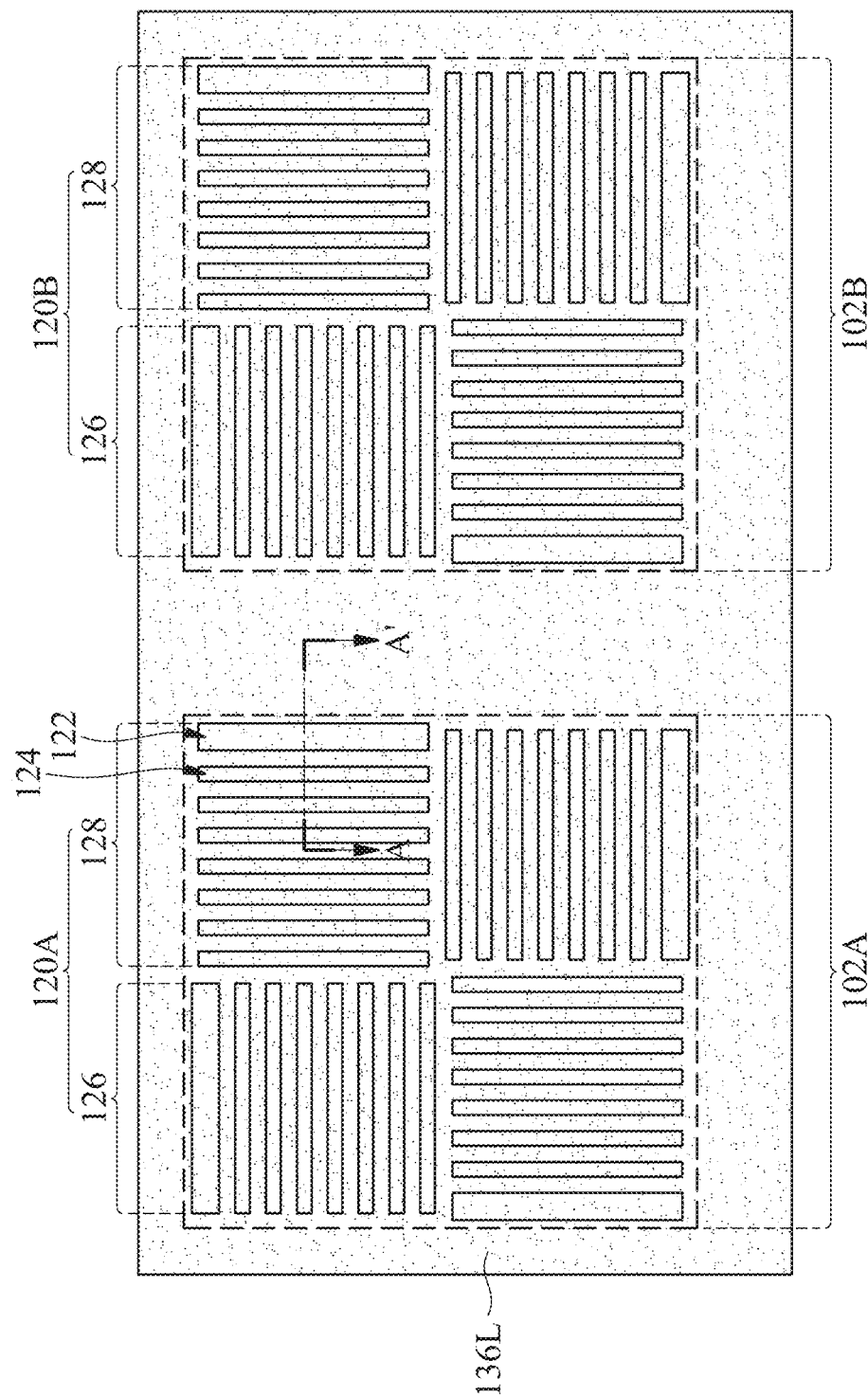
FIG. 3A is a top view of the semiconductor structure of FIG. 2A after forming a capacitor material stack over the substrate and within trenches of trench arrays, in accordance with some embodiments.
Figure 3B:
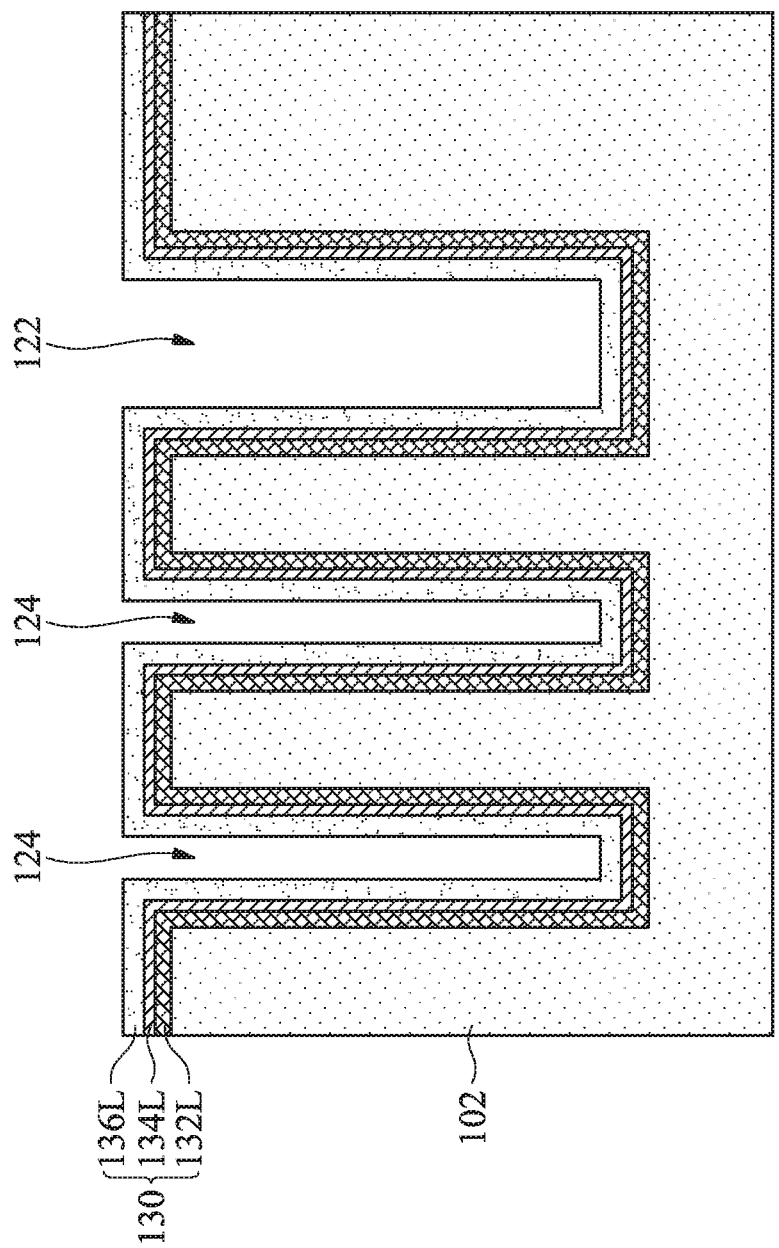
FIG. 3B is a cross-sectional view of a portion of the semiconductor structure of FIG. 3A along line A-A'.

FIG. 3A is a top view of the semiconductor structure of FIG. 2A following deposition of a capacitor material stack 130, in according with some embodiments. FIG. 3B is a cross-sectional view of a portion of the semiconductor structure of FIG. 3A taken along line A-A'.

Referring to FIGS. 3A and 3B, the capacitor material stack 130 includes a first conductive layer 132L, a capacitor dielectric layer 134L, and a second conductive layer 136L.

The first conductive layer 132L is deposited along sidewalls and bottom surfaces of trenches 122, 124 in each trench array 120A, 120B and over the top surface of substrate 102. In some embodiments, the first conductive layer 132L is formed using CVD, PECVD, PVD, ALD, or any other suitable methods, or combination of methods, for forming a generally conformal conductive layer. Examples of suitable materials for the first conductive layer 132L include, but are not limited to, metals, metal nitrides, silicides, metal alloys, or other suitable electrically conductive materials or combinations thereof. In some embodiments, the first conductive layer 132L has a single layer structure. In some embodiments, the first conductive layer 132L has a multiple-layer structure including two or more materials that provide conductive and/or additional functionality including, for example, a barrier layer, a capping layer, a seed layer, and/or other suitable layers (not shown) that are selected to provide a predetermined combination of desired conductive properties. In some embodiments, the first conductive layer 132L includes a metal nitride such as titanium nitride (TiN) or tantalum nitride (TaN).

In some embodiments, prior to depositing the first conductive layer 132L, an oxide liner (not shown) is optionally formed on exposed surfaces of substrate 102, including top surface of substrate 102 and sidewalls and bottom surfaces of trenches 122, 124 in trench arrays 120A, 120B, for improving trench interface. In some embodiments, the oxide liner is grown by a deposition process or a thermal oxidation process. In some embodiments, the oxide liner includes silicon dioxide.

The capacitor dielectric layer 134L is deposited over the first conductive layer 132L. In some embodiments, the capacitor dielectric layer 134L is deposited using CVD, PVD, PECVD, ALD, or any other suitable methods, or combination of methods, for forming a generally conformal dielectric layer. In some embodiments, the capacitor dielectric layer 134L includes a single layer. In some embodiments, the capacitor dielectric layer 134L includes a multilayer structure of one or more suitable dielectric materials. In some embodiments, the capacitor dielectric layer 134L includes silicon dioxide or silicon nitride. In some embodiments, the capacitor dielectric layer 134L includes a high dielectric constant (high-k) material having a dielectric constant greater than silicon dioxide. Examples of high-k dielectric materials include, but are not limited to, hafnium oxide ($HfO_x$), lanthanum monoxide (LaO), aluminum monoxide (AlO), aluminum oxide ($Al_2O_3$), zirconium monoxide (ZrO), titanium monoxide (TiO), tantalum pentoxide ($Ta_2O_5$), strontium titanate ($SrTiO_3$), barium titanate ($BaTiO_3$), hafnium silicate (HfSiO), lanthanum silicate (LaSiO), aluminum silicate (AlSiO), or hafnium titanate ($HfTiO_4$).

The second conductive layer 136L is deposited over the capacitor dielectric layer 134L. In some embodiments, the second conductive layer 136L includes the same conductive material(s) and structure(s) described in connection with the first conductive layer 132L and/or is deposited using the same process(es) utilized in connection with the first conductive layer 132L. In some embodiments, one or more of the conductive layers of the second conductive layer 136L exhibits a different structure than that of the first conductive layer 132L in terms of the conductive material(s) utilized, the thicknesses of the material layer(s) of the second conductive layer 136L and/or the process(es) used to deposit the second conductive layer 136L. In some embodiments, the second conductive layer 136L includes TiN or a bilayer of titanium nitride/tungsten (TiN/W).

In order to maximize the capacitance, in some embodiments, additional pairs of capacitor dielectric layers and conductive layers (not shown) are sequentially deposited over the second conductive layer 136L for formation of stacked MIM capacitors. The number of additional pairs of capacitor dielectric layers and conductive layers for capacitor material stack 130 depends on the width of inner trenches 124 in each trenches array 120A, 120B and design requirements.

Figure 4A:
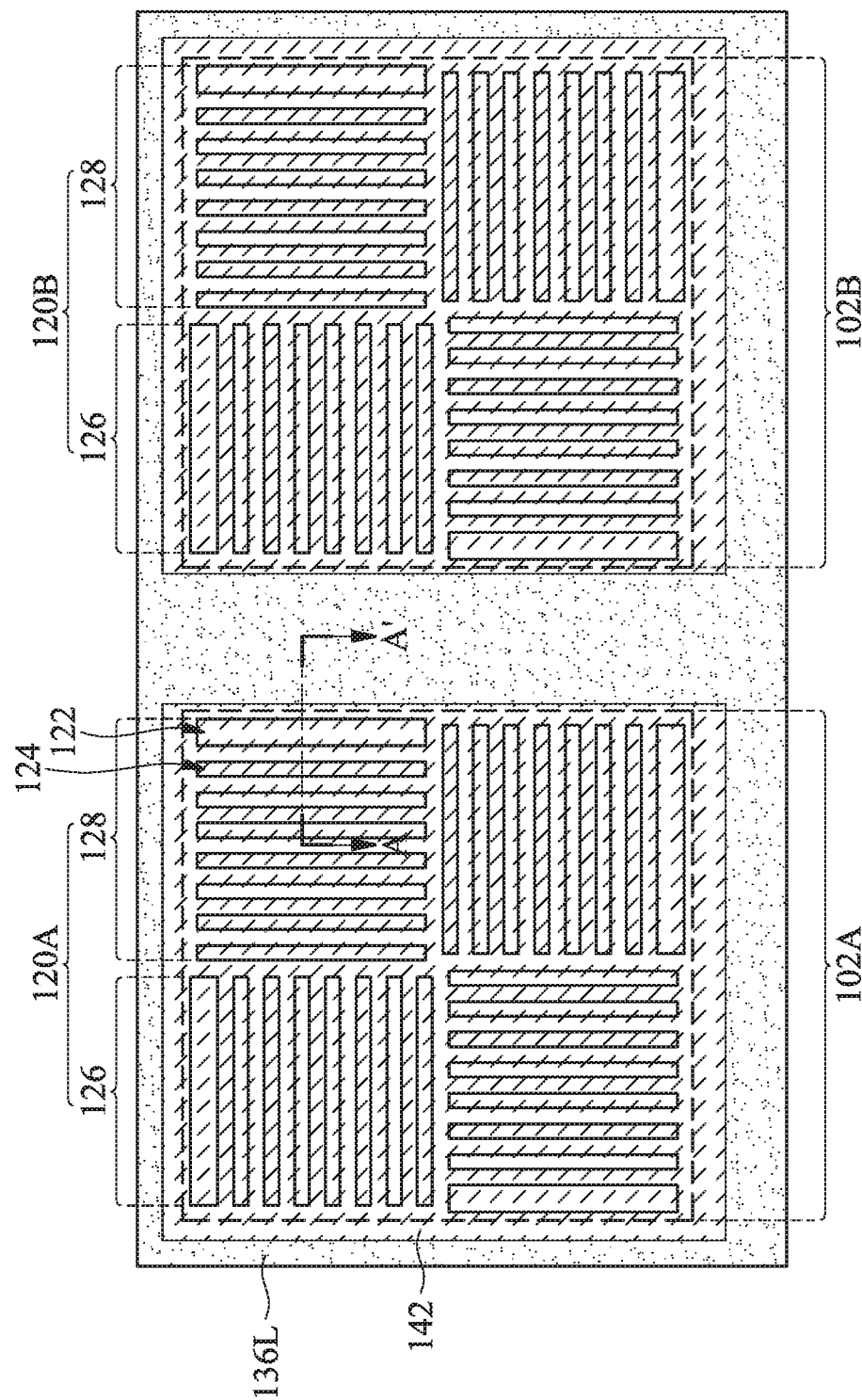
FIG. 4A is a top view of the semiconductor structure of FIG. 3A after forming a patterned photoresist layer over a topmost surface of the capacitor material stack, in accordance with some embodiments.
Figure 4B:
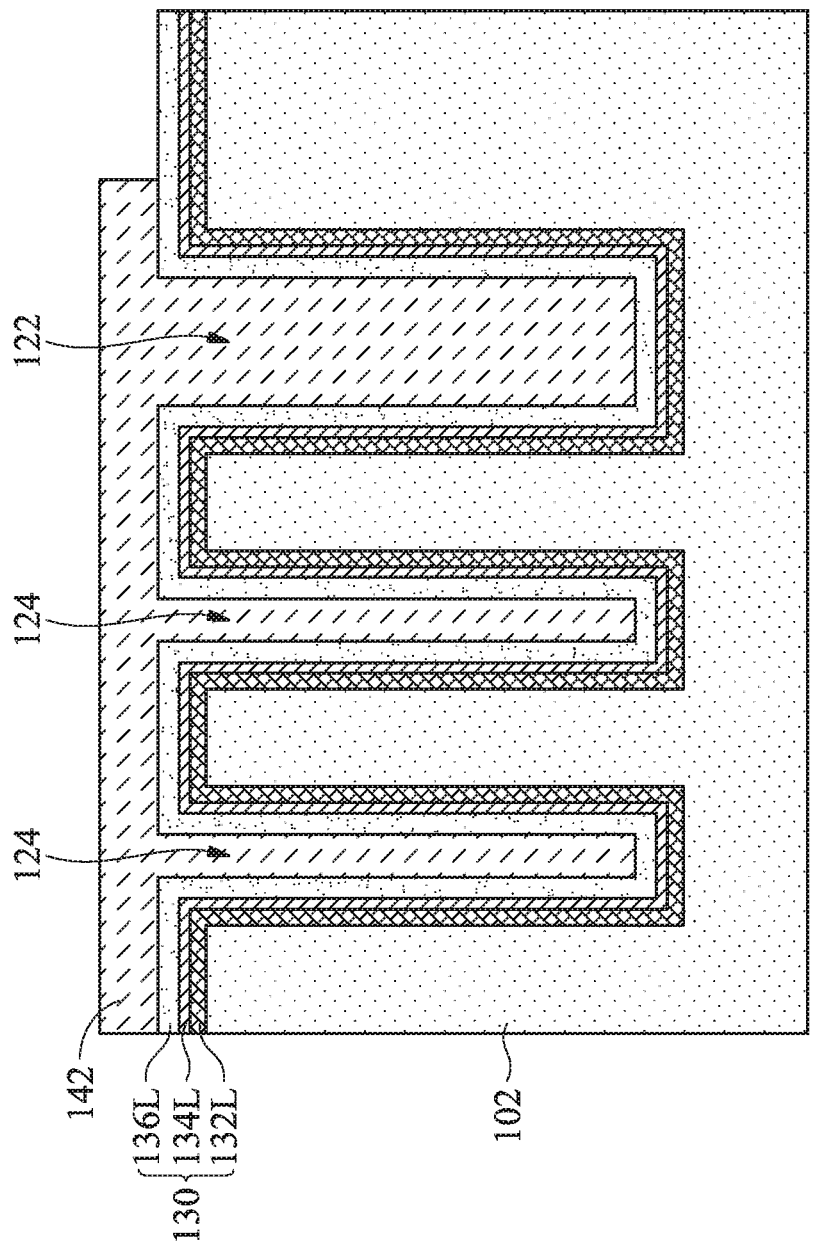
FIG. 4B is a cross-sectional view of a portion of the semiconductor structure of FIG. 4A along line A-A'.

FIG. 4A is a top view of the semiconductor structure of FIG. 3A following formation of a patterned photoresist layer 142, in according with some embodiments. FIG. 4B is a cross-sectional view of a portion of the semiconductor structure of FIG. 4A taken along line A-A'.

Referring to FIGS. 4A and 4B, the patterned photoresist layer 142 is disposed within trenches arrays 120A, 120B and over portions of the substrate 102. The patterned photoresist layer 142 covers portions of second conductive layer 136L over the substrate 102 and adjacent to trenches arrays 120A, 120B. In some embodiments, the patterned photoresist layer 142 is formed by first depositing a photoresist layer (not shown), for example, by spin coating, and patterning the photoresist layer using the photolithography patterning process described above in formation of trenches arrays 120A, 120B. The enlarged width of the outer trenches 122 at the periphery of each trench array 120A, 120B allows outer trenches 122 to be easily filled with photoresist, thereby avoiding generation of seam defects or other fill defects in patterned photoresist layer 142 during dry steps of photolithography patterning process. The enlarged trench width at the array edge thus improves edge loading effect of deep trench arrays and prevents distortion of photoresist pattern profile. As a result, the photoresist pattern profile abnormalities are reduced, which helps to reduce patterning defect in subsequent patterning processes in formation of capacitors.

Figure 5A:
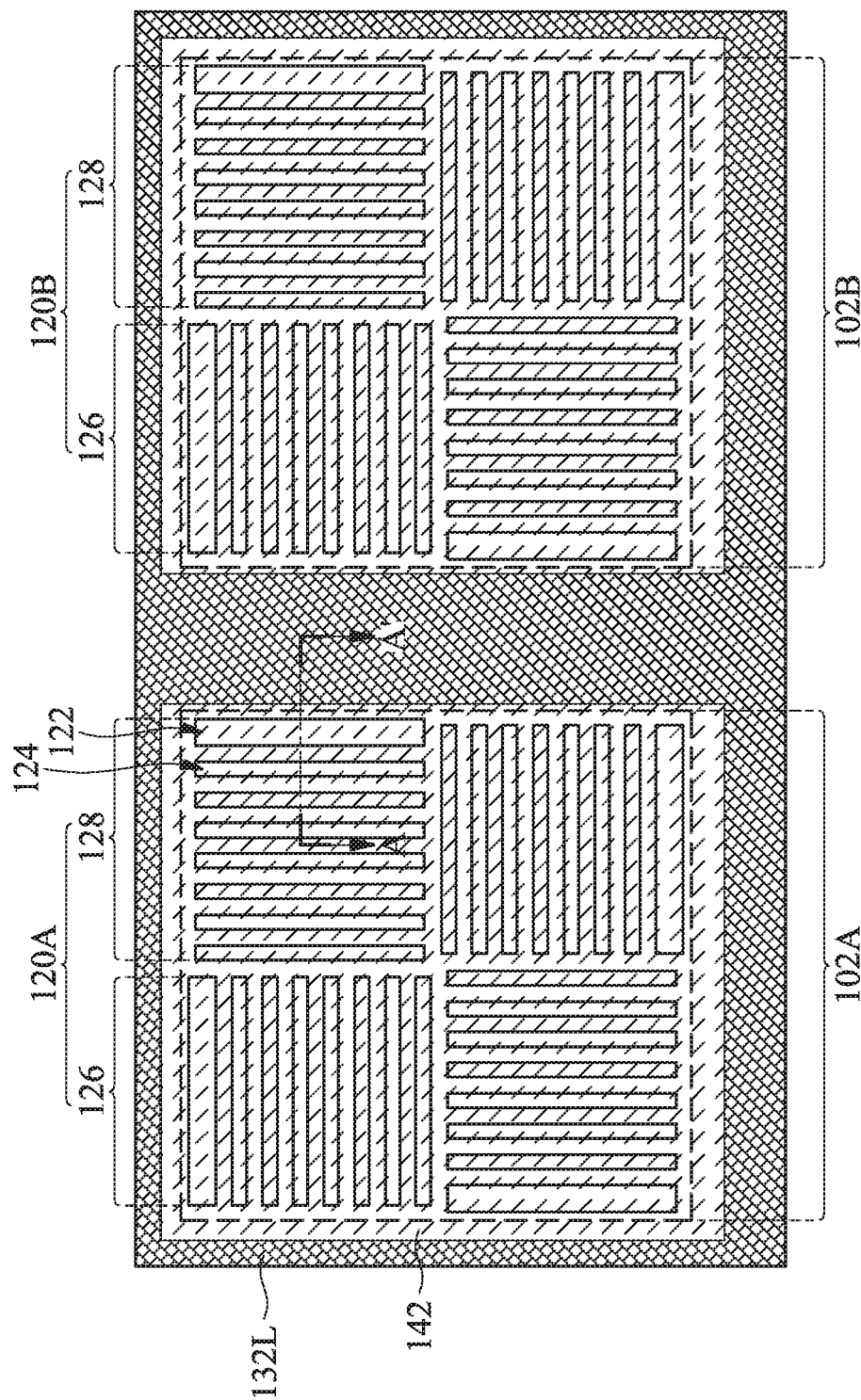
FIG. 5A is a top view of the semiconductor structure of FIG. 4A after patterning a second conductive layer and a capacitor dielectric layer of the capacitor material stack, in accordance with some embodiments.
Figure 5B:
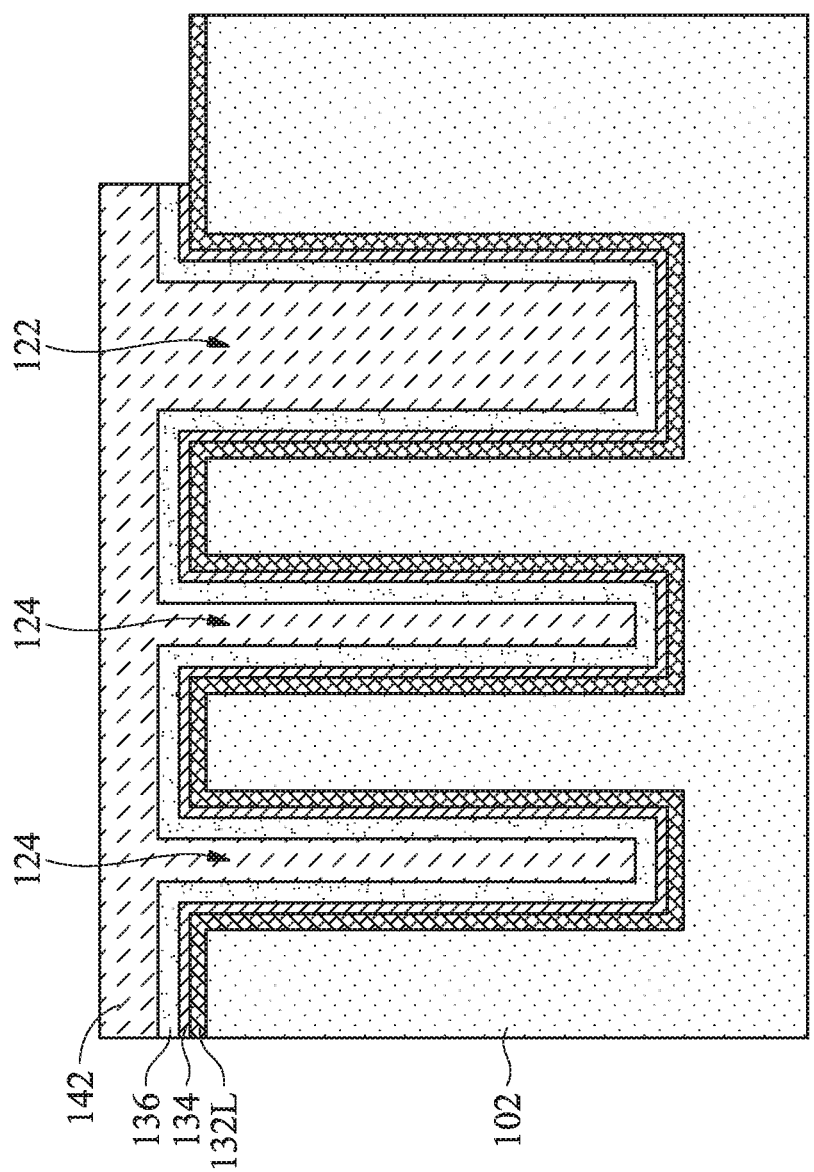
FIG. 5B is a cross-sectional view of a portion of the semiconductor structure of FIG. 5A along line A-A'.

FIG. 5A is a top view of the semiconductor structure of FIG. 4A following patterning of second conductive layer 136L and capacitor dielectric layer 134L, in according with some embodiments. FIG. 5B is a cross-sectional view of a portion of the semiconductor structure of FIG. 5A taken along line A-A'.

Referring to FIGS. 5A and 5B, at least one patterning process is performed to remove portions of second conductive layer 136L and capacitor dielectric layer 134L that are not covered by the patterned photoresist layer 142. In some embodiments, the portions of second conductive layer 136L and capacitor dielectric layer 134L that are not covered by the patterned photoresist layer 142 are etched using multiple etching processes. In some embodiments, a first anisotropic etch is performed to remove the exposed portions of the second conductive layer 136L, exposing portions of capacitor dielectric layer 134L. In some embodiments, the first anisotropic etch is a dry etching process such as, for example, RIE or a wet etching process that removes the conductive material providing the second conductive layer 136L selective to the dielectric material providing the capacitor dielectric layer 134L. A second anisotropic etch is then performed to remove the exposed portions of the capacitor dielectric layer 134L, exposing portions of first conductive layer 132L. In some embodiments, the second anisotropic etch is a dry etching process such as, for example, RIE or a wet etching process that removes the dielectric material providing the capacitor dielectric layer 134L selective to the conductive material providing the first conductive layer 132L. After etching, a remaining portion of the second conductive layer 136L in each region 102A, 102B of substrate 102 constitutes an upper capacitor electrode 136 for respective trench capacitors 110A, 110B, and a remaining portion of the capacitor dielectric layer 134L in each region 102A, 102B of substrate 102 constitutes a capacitor dielectric 134 for respective trench capacitors 110A, 110B. The patterned photoresist layer 142 is subsequently re moved, for example, by ashing.

Figure 6A:
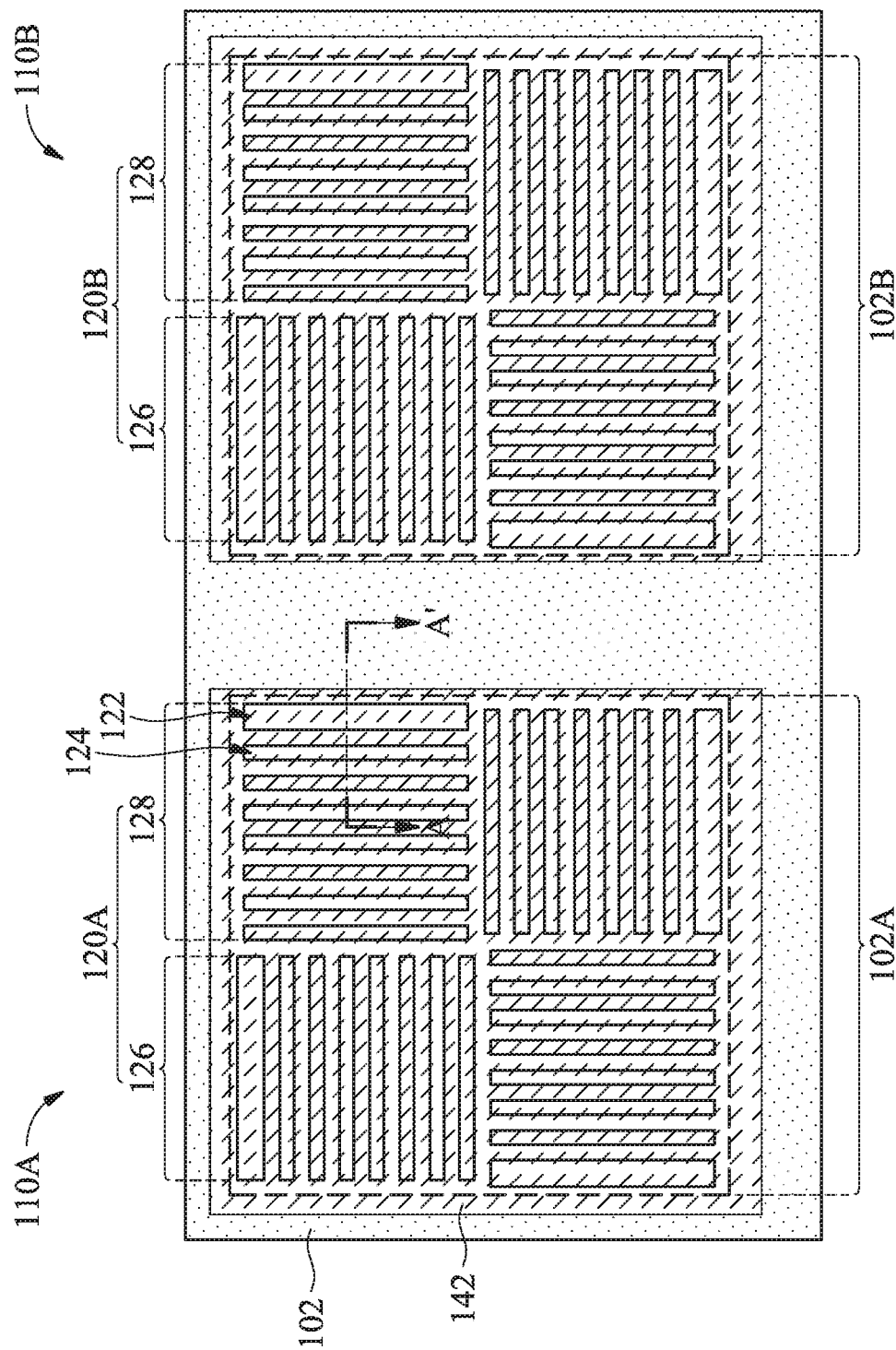
FIG. 6A is a top view of the semiconductor structure of FIG. 5A after patterning a first conductive layer of the capacitor material stack, in accordance with some embodiments.
Figure 6B:
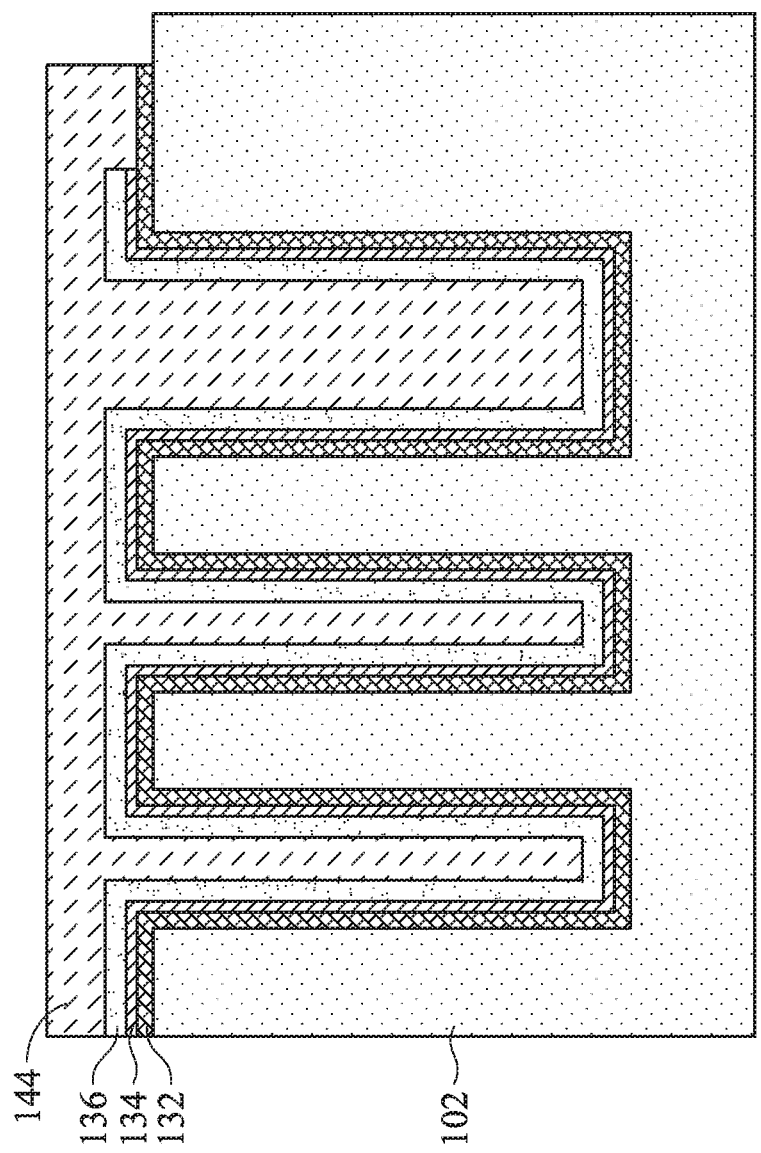
FIG. 6B is a cross-sectional view of a portion of the semiconductor structure of FIG. 6A along line A-A'.

FIG. 6A is a top view of the semiconductor structure of FIG. 5A following formation of a patterned photoresist layer 144 and patterning of first conductive layer 132L, in according with some embodiments. FIG. 6B is a cross-sectional view of a portion of the semiconductor structure of FIG. 6A taken along line A-A'.

Referring to FIGS. 6A and 6B, the patterned photoresist layer 144 is disposed over upper capacitor electrodes 136 and first conductive layer 132L, exposing a portion of first conductive layer 132L between first trench array 120A and second trench array 120B (not shown). The patterned photoresist layer 144 is formed using the processing steps described above with respect to formation of patterned photoresist layer 142. After formation of patterned photoresist layer 144, the first conductive layer 132L is etched to remove portions of first conductive layer 132 that are not covered by the patterned photoresist layer 144 to form trench capacitors 110A, 110B. In some embodiments, an anisotropic etch is performed to pattern the first conductive layer 132L. In some embodiments, the anisotropic etch is a RIE or a plasma etching process. A remaining portion of first conductive layer 132L in each region 102A, 102B of the substrate 102 constitutes a lower capacitor electrode 132 for respective trench capacitors 110A, 110B. Each lower capacitor electrode 132 is disposed over a top surface of a corresponding region of substrate 102A, 102B and along sidewall and bottom surfaces of trenches in a corresponding trench array 120A, 120B. The patterned photoresist layer 144 is subsequently removed, for example, by ashing.

A first trench capacitor 110A is formed in the first region 102A of the substrate 102 spanning multiple trenches in the first trench array 120A, and a second trench capacitor 110B is formed in the second region 102B of the substrate 102 spanning multiple trenches in the second trench array 120B. Each trench capacitor 110A, 110B includes at least a lower capacitor electrode 132, an upper capacitor electrode 136, and a capacitor dielectric 134 separating lower capacitor electrodes 132 and upper capacitor electrode 136. In some embodiments, each trench capacitor 110A, 110B also includes additional pairs of capacitor dielectric and capacitor electrode (not shown) over the upper capacitor electrode 136 (not shown).

The present deep trench array design with enlarged trench width at the array edge helps to reduce or eliminate photoresist pattern profile abnormalities caused by array edge loading effect, thus helps to prevent defect formation and incomplete removal of capacitor metals in subsequent capacitor metal etching. Because present deep trench array design ensures complete removal of capacitor metals, no capacitor metal residue is present between neighboring deep trench capacitors. The deep trench array design of the present disclosure eliminates capacitor metal bridges between neighboring deep trench capacitors. As a result, the capacitor reliability is increased.

Figure 7A:
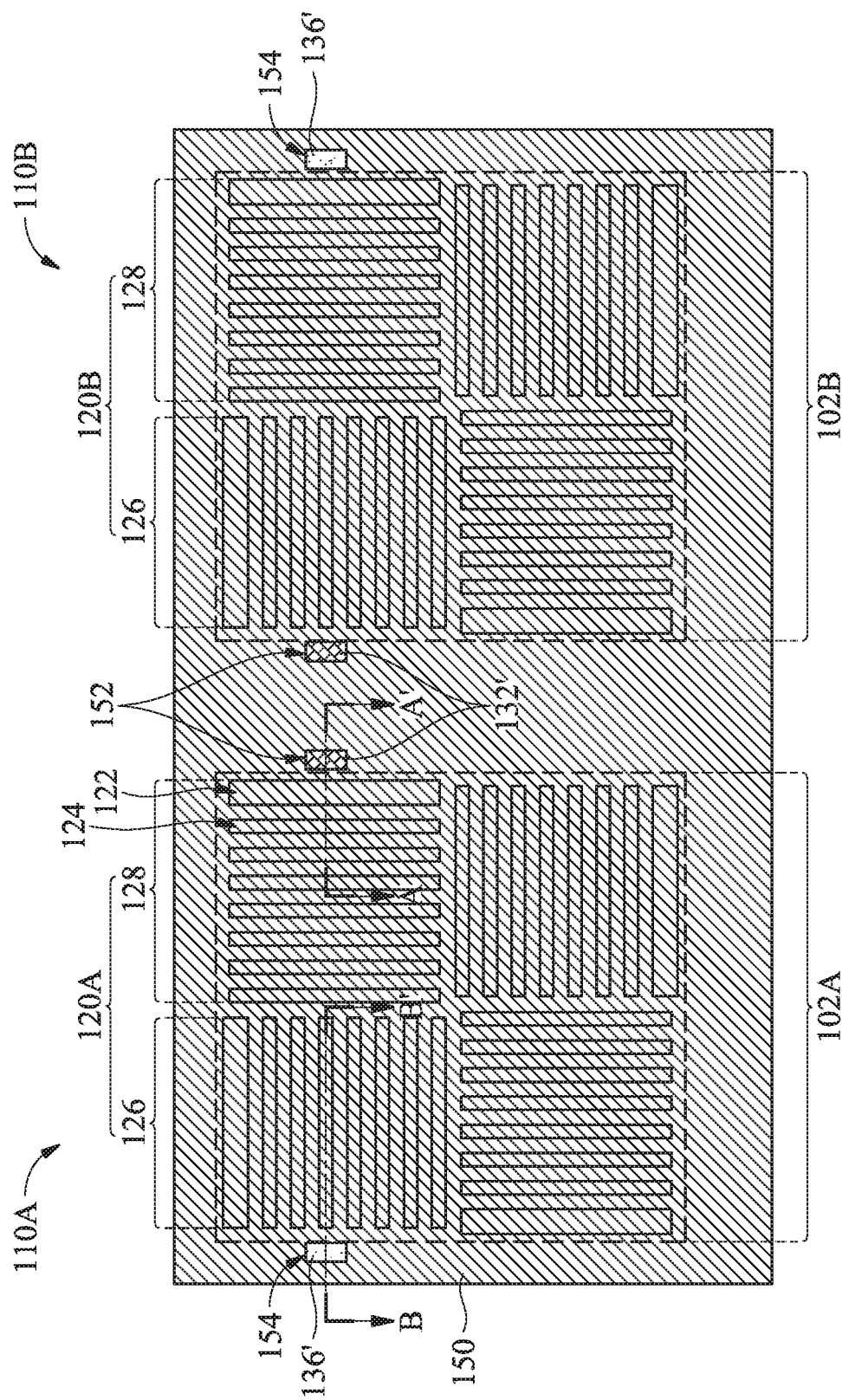
FIG. 7A is a top view of the semiconductor structure of FIG. 6A after forming contact openings in an interlayer dielectric (ILD) layer, in accordance with some embodiments.
Figure 7B:
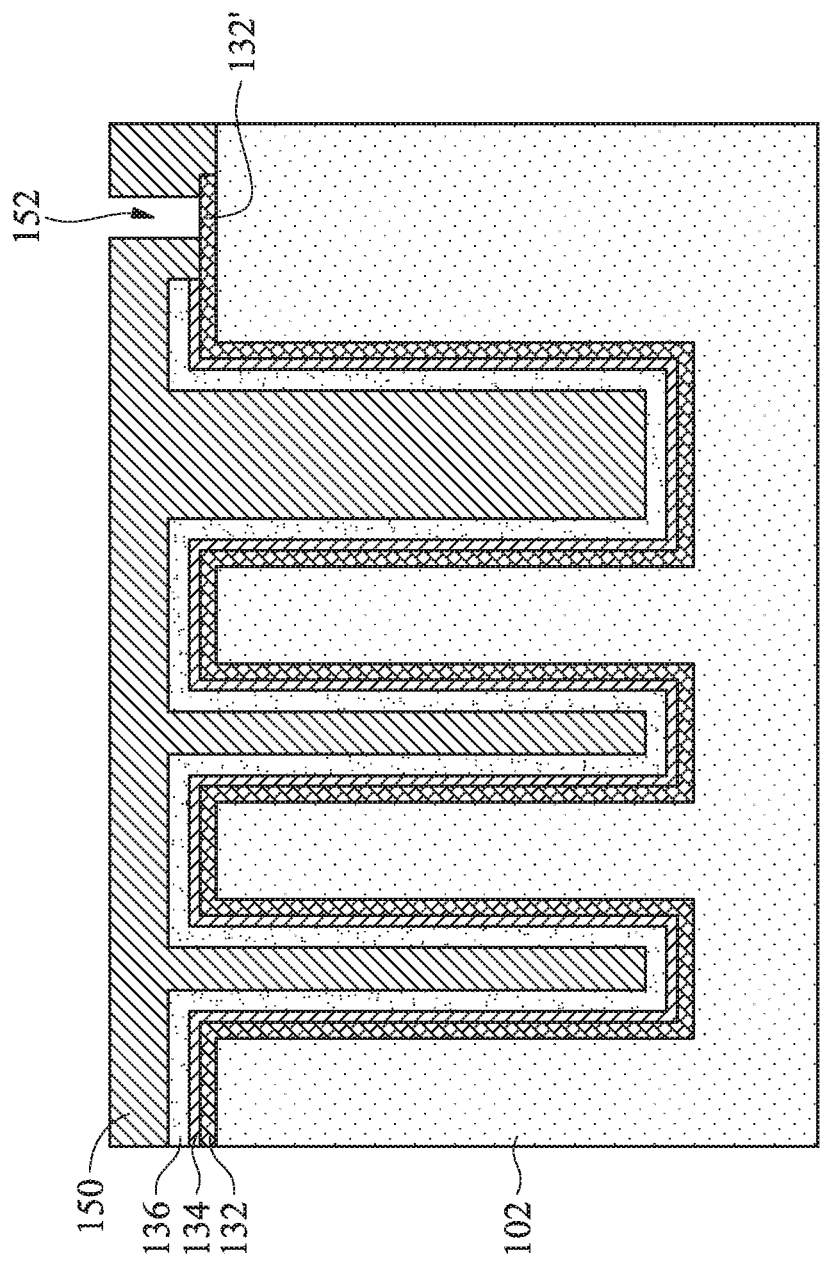
FIG. 7B is a cross-sectional view of a portion of the semiconductor structure of FIG. 7A along line A-A'.
Figure 7C:
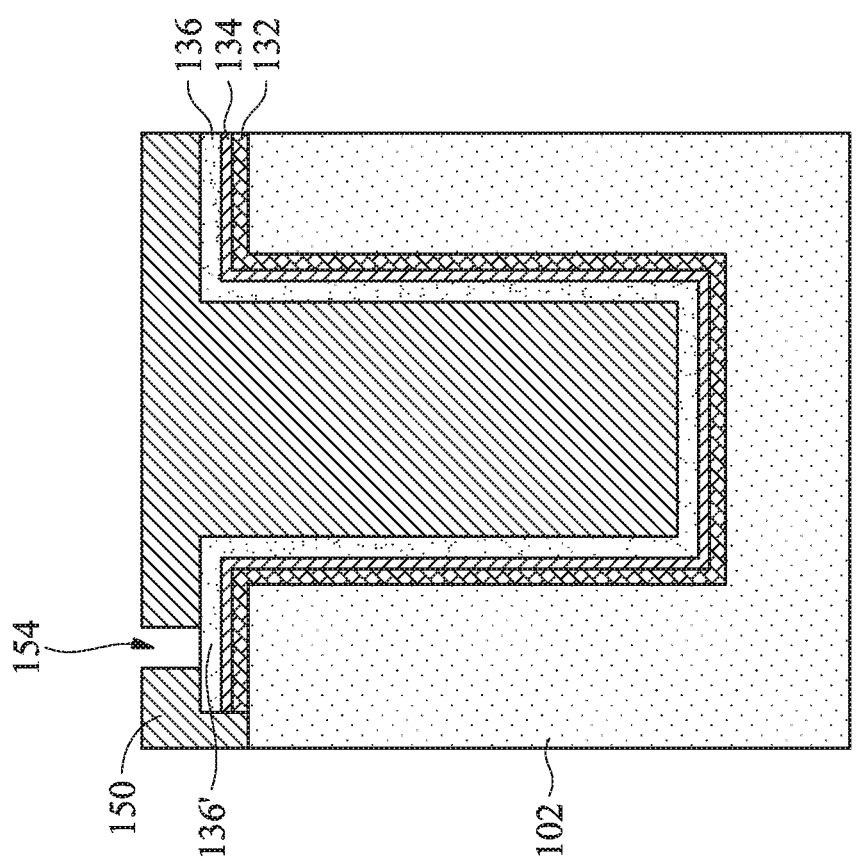
FIG. 7C is a cross-sectional view of another portion of the semiconductor structure of FIG. 7A along line B-B'.

FIG. 7A is a top view of the semiconductor structure of FIG. 6A following formation of an interlayer dielectric (ILD) layer 150 and contact openings 152, 154 within ILD layer 150, in according with some embodiments. FIG. 7B is a cross-sectional view of a portion of the semiconductor structure of FIG. 7A taken along line A-A'. FIG. 7C is a cross-sectional view of another portion of the semiconductor structure of FIG. 7A taken along line B-B'.

Referring to FIGS. 7A-7C, the ILD layer 150 is deposited over substrate 102 and trench capacitors 110A, 110B. The ILD layer 150 electrically insulates trench capacitors 110A, 110B. In some embodiments, the ILD layer 150 includes a silicon dioxide, silicon nitride, silicon oxynitride or a low dielectric constant (low-k) material having a dielectric constant less than about 3.9. In some embodiments, the ILD layer 150 includes spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, parylene, BCB (bis-benzocyclobutenes), SiLK (Dow Chemical, Midland, Mich.), polyimide, and/or other suitable materials. In some embodiments, the ILD layer 150 is formed by CVD, PECVD, PVD, ALD, spin coating, other suitable formation process(es), or combinations thereof.

Subsequently, contact openings 152, 154 are defined within the ILD layer 150. First contact openings 152 are formed extending through the ILD layer 150, each exposing a contact region 132' of a corresponding lower capacitor electrode 132. Second contact openings 154 are formed extending through the ILD layer 150, each exposing a contact region 136' of a corresponding upper capacitor electrode 136. In some embodiments, a contact etch pattern (not shown) is first formed on the surface of the ILD layer 150. The contact etch pattern exposes predetermined regions of the ILD layer 150 overlying the capacitor electrodes 132, 136. In some embodiments, a plasma etching process, a combination wet/dry etching processes, other suitable etching process(es), or a combination thereof, is then used to form contact openings 152, 154.

Figure 8A:
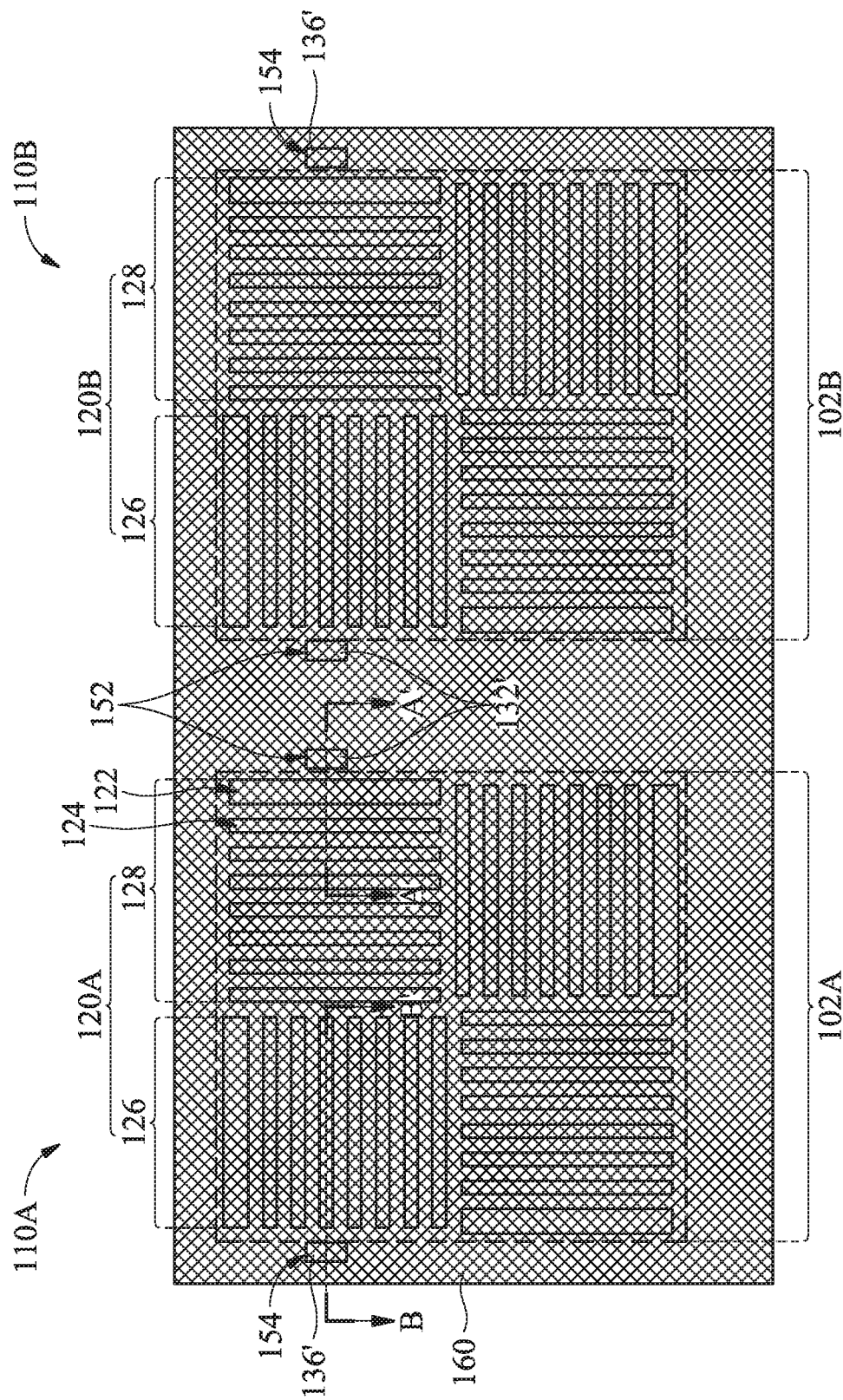
FIG. 8A is a top view of the semiconductor structure of FIG. 7A after depositing a contact material layer, in accordance with some embodiments.
Figure 8B:
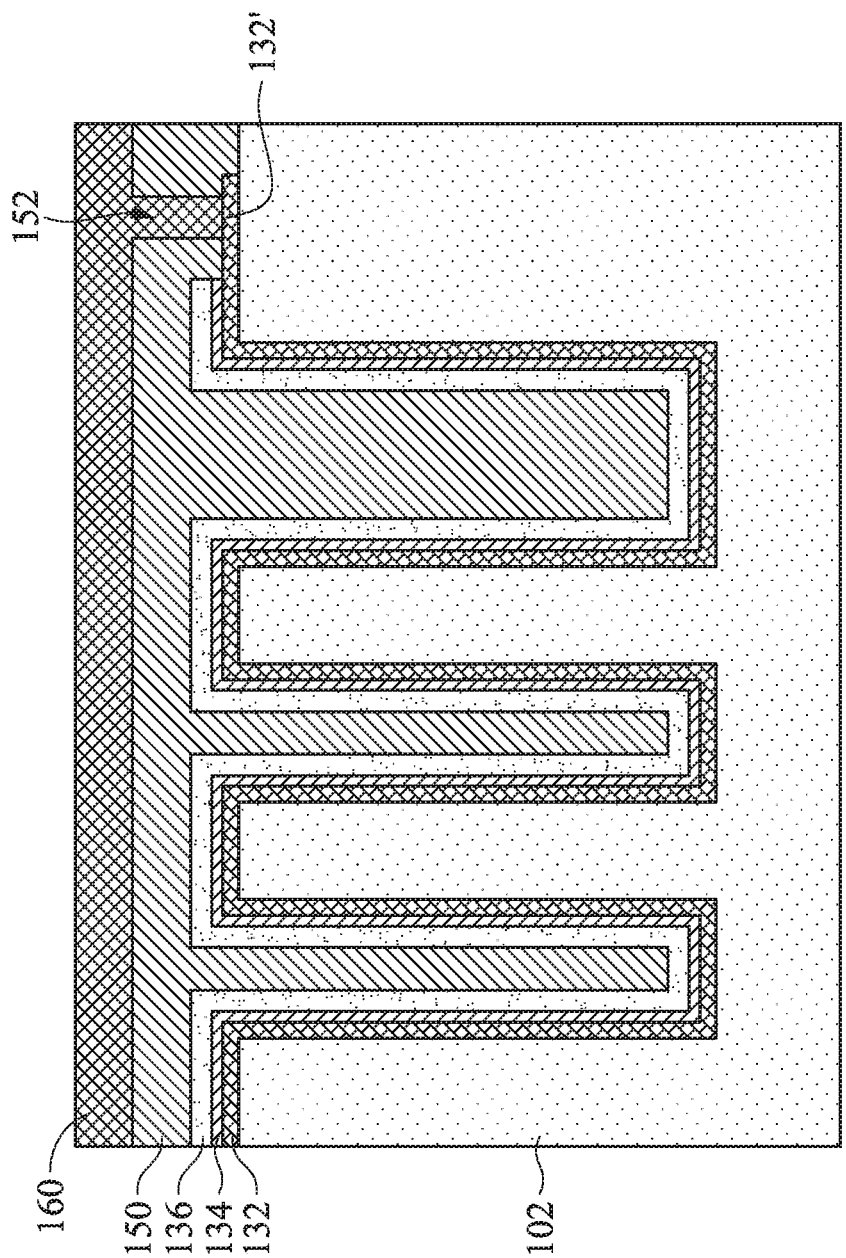
FIG. 8B is a cross-sectional view of a portion of the semiconductor structure of FIG. 8A along line A-A'.
Figure 8C:
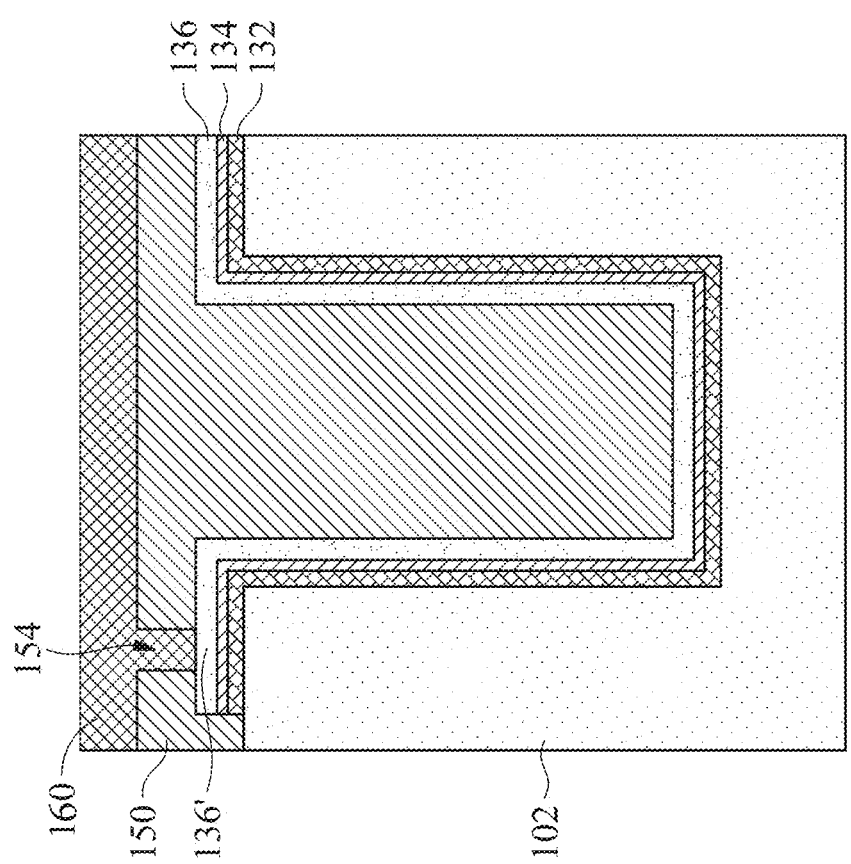
FIG. 8C is a cross-sectional view of another portion of the semiconductor structure of FIG. 8A along line B-B'.

FIG. 8A is a top view of the semiconductor structure of FIG. 7A following deposition of a conductive contact material layer 160 in accordance with some embodiments. FIG. 8B is a cross-sectional view of a portion of the semiconductor structure of FIG. 8A taken along line A-A'. FIG. 8C is a cross-sectional view of another portion of the semiconductor structure of FIG. 8A along line B-B'.

Referring to FIGS. 8A-8C, the conductive contact material layer 160 is applied to fill contact openings 152, 154 and to contact capacitor electrodes 132, 136. In some embodiments, the conductive contact material layer 160 includes a single material while in other embodiments a multi-layer structure is utilized. In some embodiments, the conductive contact material layer 160 includes a barrier layer (not shown) for suppressing diffusion between the materials separated by the barrier layer, e.g., the capacitor electrodes 132, 136 and one or more of the conductive materials comprising a portion of the conductive contact material layer 160. In some embodiments, the conductive contact material layer 160 includes copper, aluminum, tungsten, or another suitable conductive material. In some embodiments, the conductive contact material layer 160 is deposited using plating, PVD, sputtering, or another suitable formation process.

Subsequently, the conductive contact material layer 160 is planarized using CMP, grinding, etching or another suitable method to remove an upper portion of the conductive contact material layer 160 and expose a top surface of the ILD layer 150 while leaving a residual portion of the conductive contact material layer 160 in the contact openings 152, 154 to form contact plugs 162, 164 (shown in FIGS. 1A and 1B). First contact plugs 162 provide electrical connection to lower capacitor electrodes 132 with each first contact plug 162 contacting a corresponding lower capacitor electrode 132. Second contact plugs 164 provide electrical connection to upper capacitor electrodes 136 with each second contact plug 164 contacting a corresponding upper capacitor electrodes 136.

Figure 9:
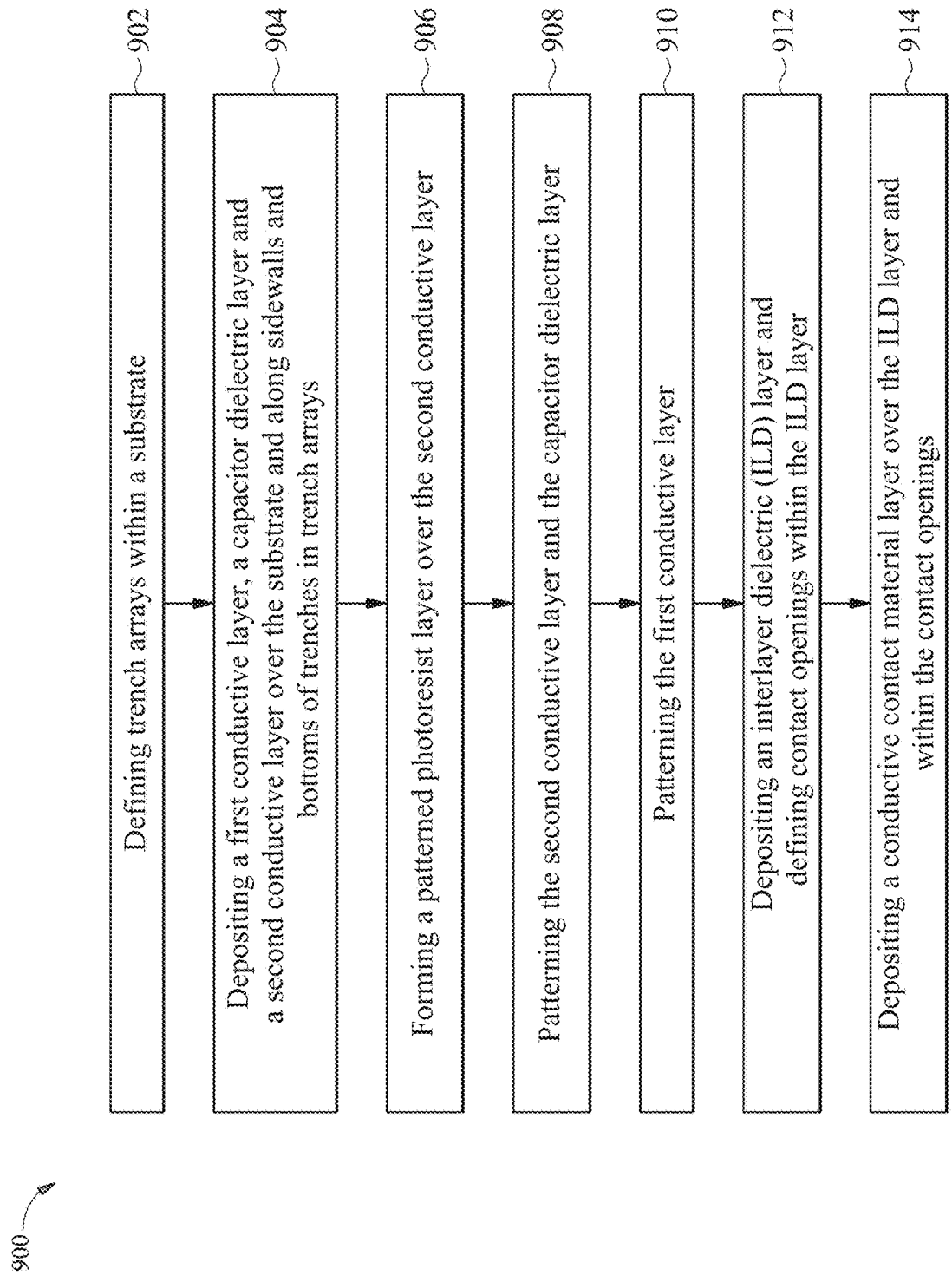
FIG. 9 is a flow chart of a method of fabricating trench capacitors, in accordance with some embodiments.

FIG. 9 is a flowchart of a method 900 of making a semiconductor structure in accordance with some embodiments. In operation 902, trench arrays are defined within a suitable substrate. Within each trench array, outer trenches at the edge of the trench array have a width greater than a width of adjacent inner trenches. In operation 904, a capacitor material stack including a first conductive layer, a capacitor dielectric layer and a second conductive layer is deposited over the substrate and along sidewalls and bottoms of trenches in trench arrays. In operation 906, a patterned photoresist layer is formed over the second conductive layer. In operation 908, the second conductive layer and the capacitor dielectric layer are patterned. In operation 910, the first conductive layer is patterned. In operation 912, an interlayer dielectric (ILD) layer is deposited over the substrate and within trenches of trench arrays. In operation 914, a conductive contact material layer is deposited over the ILD layer and within the contact openings. The contact material layer is subsequently planarized to provide contact plugs for trench capacitors.

One aspect of this description relates to a semiconductor structure. The semiconductor structure includes a substrate having a trench array therein. The trench array includes a plurality of outer trenches adjacent to and extending along a periphery of the trench array and a plurality of inner trenches. Each of the plurality of outer trenches has a width greater than a width of each of the plurality of inner trenches. The semiconductor structure further includes a capacitor material stack over the trench array. In some embodiments, the width of each of the plurality of outer trenches is about 10% to about 20% greater than the width of each of the plurality of inner trenches. In some embodiments, the capacitor material stack includes a lower capacitor electrode layer, a capacitor dielectric layer, and an upper capacitor electrode layer. In some embodiments, each of the lower capacitor electrode layer and the upper capacitor electrode layer includes TiN. In some embodiments, the capacitor dielectric layer includes silicon dioxide, silicon nitride, or a high-k dielectric material. In some embodiments, each of the plurality of outer trenches and the plurality of inner trenches has an aspect ratio independently ranging from about 20 to 1 to about 100 to 1. In some embodiments, each of the plurality of outer trenches and the plurality of inner trenches has a spacing from an adjacent trench of the trench array ranging from about 0.1 micrometer (μm) to 0.25 μm. In some embodiments, each of the plurality of inner trenches has a same width. In some embodiments, the trench array at least one first group of trenches extending along a first direction and at least one second group of trenches extending along a second direction different from the first direction. The at least one first group of trenches includes a first outer trench at a periphery of the at least one first group of trenches. The first outer trench has a width greater than a width of a first inner trench adjacent to the first outer trench. The at least one second group of trenches includes a second outer trench at a periphery of the at least one second group of trenches. The second outer trench has a width greater than a width of a second inner trench adjacent to the second outer trench. In some embodiments, each trench of the at least one first group of trenches extends substantially parallel to one another, and each trench of the at least one second group of trenches extends substantially parallel to one another. In some embodiments, the second direction is perpendicular to the first direction. In some embodiments, one first group of trenches of the at least one first group of trenches is adjacent to one second group of trenches of the at least one second group of trenches along the first direction, and the one first group of trenches is adjacent to another second group of trenches of the at least one second group of trenches along the second direction. In some embodiments, the semiconductor structure further includes contact plugs contacting the capacitor material stack.

Another aspect of this description relates to a semiconductor structure. The semiconductor structure includes a substrate having a plurality of trench array therein. The semiconductor structure also includes a plurality of capacitor material stacks. The plurality of capacitor material stacks includes a first capacitor material stack over a first trench array of the plurality of trench arrays, and a second capacitor material stack over a second trench array of the plurality of trench arrays adjacent to the first trench array. The first trench array includes a first outer trench adjacent to and extending along a periphery of the first trench array and a plurality of first inner trenches, and the first outer trench has a width greater than a width of each of the plurality of first inner trenches. The second trench array includes a second outer trench adjacent to and extending along a periphery of the second trench array and a plurality of second inner trenches, and the second outer trench has a width greater than a width of each of the plurality of second inner trenches. In some embodiments, a spacing between the periphery of the first trench array and the periphery of the second trench array is from about 2 micrometer (μm) to about 5 μm. In some embodiments, the width of the first outer trench is about 10% to about 20% greater than the width of each of the plurality of first inner trenches. In some embodiments, the first trench array includes a plurality of first groups of trenches extending along a first direction, and a plurality of second groups of trenches extending along a second direction different from the first direction. An outer trench of the plurality of first group of trenches, at a periphery of the plurality of first groups of trenches, has a width greater than a width of an inner trench of the plurality of first group of trenches. An outer trench of the plurality of second group of trenches, at a periphery of the plurality of second groups of trenches, has a width greater than a width of an inner trench of the plurality of second group of trenches.

Still another aspect of this description relates to a method of forming a semiconductor structure. The method includes etching a substrate to define a plurality of trench arrays in the substrate. Each trench array of the plurality of trench arrays includes an outer trench adjacent to and extending along a periphery of each trench array of the plurality of trench array and a plurality of inner trenches. The outer trench has a width greater than a width of each of the plurality of inner trenches. The method further includes depositing a first conductive layer along sidewalls and bottoms of trenches of each trench array of the plurality of trench arrays, and on a top surface of the substrate, depositing a capacitor dielectric layer over the first conductive layer, depositing a second conductive layer over the dielectric layer, and patterning the second conductive layer, the capacitor dielectric layer and the first conductive layer to form a capacitor in a corresponding trench array of the plurality of trench arrays. In some embodiments, the etching of the substrate to define the plurality of trench arrays includes defining a plurality of first groups of trenches extending along a first direction, and defining a plurality of second groups of trenches extending along a second direction different from the first direction. An outer trench of the plurality of first group of trenches, at a periphery of the plurality of first groups of trenches, has a width greater than a width of an inner trench of the plurality of first group of trenches. An outer trench of the plurality of second group of trenches, at a periphery of the plurality of second groups of trenches, has a width greater than a width of an inner trench of the plurality of second group of trenches. In some embodiments, the method further includes forming contact plugs contacting the capacitor in each trench array of the plurality of trench arrays.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having a trench array therein, wherein the trench array includes a plurality of outer trenches adjacent to and extending along a periphery of the trench array and a plurality of inner trenches, wherein each of the plurality of outer trenches has a width greater than a width of each of the plurality of inner trenches; and
   a capacitor material stack over the trench array.

2. The semiconductor structure of claim 1, wherein the width of each of the plurality of outer trenches is about 10% to about 20% greater than the width of each of the plurality of inner trenches.

3. The semiconductor structure of claim 1, wherein the capacitor material stack comprises a lower capacitor electrode layer, a capacitor dielectric layer, and an upper capacitor electrode layer.

4. The semiconductor structure of claim 3, wherein each of the lower capacitor electrode layer and the upper capacitor electrode layer comprises TiN.

5. The semiconductor structure of claim 3, wherein the capacitor dielectric layer comprises silicon dioxide, silicon nitride, or a high-k dielectric material.

6. The semiconductor structure of claim 1, wherein each of the plurality of outer trenches and the plurality of inner trenches has an aspect ratio ranging from about 20 to 1 to about 100 to 1.

7. The semiconductor structure of claim 1, wherein each of the plurality of outer trenches and the plurality of inner trenches has a spacing from an adjacent trench of the trench array ranging from about 0.1 micrometer (μm) to 0.25 μm.

8. The semiconductor structure of claim 1, wherein each of the plurality of inner trenches has a same width.

9. The semiconductor structure of claim 1, wherein the trench array comprises:
   at least one first group of trenches extending along a first direction, wherein the at least one first group of trenches comprises a first outer trench at a periphery of the at least one first group of trenches, and the first outer trench has a width greater than a width of a first inner trench adjacent to the first outer trench; and
   at least one second group of trenches extending along a second direction different from the first direction, wherein the at least one second group of trenches comprises a second outer trench at a periphery of the at least one second group of trenches, and the second outer trench has a width greater than a width of a second inner trench adjacent to the second outer trench.

10. The semiconductor structure of claim 9, wherein each trench of the at least one first group of trenches extends substantially parallel to one another, and each trench of the at least one second group of trenches extends substantially parallel to one another.

11. The semiconductor structure of claim 9, wherein the second direction is perpendicular to the first direction.

12. The semiconductor structure of claim 9, wherein one first group of trenches of the at least one first group of trenches is adjacent to one second group of trenches of the at least one second group of trenches along the first direction, and the one first group of trenches is adjacent to another second group of trenches of the at least one second group of trenches along the second direction.

13. The semiconductor structure of claim 1, further comprising contact plugs contacting the capacitor material stack.

14. A semiconductor structure, comprising:
a substrate having a plurality of trench arrays therein; and
a plurality of capacitor material stacks, wherein the plurality of capacitor material stacks comprises:
- a first capacitor material stack over a first trench array of the plurality of trench arrays, wherein the first trench array comprises a first outer trench adjacent to and extending along a periphery of the first trench array and a plurality of first inner trenches, the first outer trench has a width greater than a width of each of the plurality of first inner trenches, and
- a second capacitor material stack over a second trench array of the plurality of trench arrays adjacent to the first trench array, wherein the second trench array comprises a second outer trench adjacent to and extending along a periphery of the second trench array and a plurality of second inner trenches, the second outer trench has a width greater than a width of each of the plurality of second inner trenches.

15. The semiconductor structure of claim 14, wherein a spacing between the periphery of the first trench array and the periphery of the second trench array is from about 2 micrometer (μm) to about 5 μm.

16. The semiconductor structure of claim 14, wherein the width of the first outer trench is about 10% to about 20% greater than the width of each of the plurality of first inner trenches.

17. The semiconductor structure of claim 14, wherein the first trench array comprises:
- a plurality of first groups of trenches extending along a first direction, wherein an outer trench of the plurality of first group of trenches, at a periphery of the plurality of first groups of trenches, has a width greater than a width of an inner trench of the plurality of first group of trenches, and
- a plurality of second groups of trenches extending along a second direction different from the first direction, wherein an outer trench of the plurality of second group of trenches, at a periphery of the plurality of second groups of trenches, has a width greater than a width of an inner trench of the plurality of second group of trenches.

18. A semiconductor structure, comprising:
a substrate;
a first trench in the substrate;
a plurality of second trenches in the substrate, wherein the first trench is closer to an edge of the substrate than each of the plurality of second trenches, and a width of the first trench is different from a width of each of the plurality of second trenches; and
a capacitor material stack extending into the first trench and into each of the plurality of second trenches;
a first contact outside of the first trench and the plurality of second trenches, wherein the first contact is electrically connected to the capacitor material stack; and
a second contact outside the first trench and the plurality of second trenches, wherein the second contact is electrically connected to the capacitor material stack.

19. The semiconductor structure of claim 18, wherein the first contact is on a first side of the plurality of second trenches, and the second contact is on a second side of the plurality of second trenches opposite the first side.

20. The semiconductor structure of claim 18, wherein the capacitor material stack comprises:
- a first electrode, wherein the first contact is electrically connected to the first electrode;
- a dielectric layer on the first electrode; and
- a second electrode on the dielectric layer, wherein the second contact is electrically connected to the second electrode.

* * * * *